United States Patent
Chen et al.

(10) Patent No.: US 9,069,033 B2
(45) Date of Patent: Jun. 30, 2015

(54) 3-AXIS MAGNETIC FIELD SENSOR, METHOD FOR FABRICATING MAGNETIC FIELD SENSING STRUCTURE AND MAGNETIC FIELD SENSING CIRCUIT

(71) Applicant: Industrial Technology Research Institute, Hsinchu (TW)

(72) Inventors: Young-Shying Chen, Hsinchu (TW);
Keng-Ming Kuo, Yunlin County (TW);
Ding-Yeong Wang, Hsinchu County (TW); Cheng-Wei Chien, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 180 days.

(21) Appl. No.: 13/907,960

(22) Filed: Jun. 2, 2013

(65) Prior Publication Data
US 2014/0292312 A1 Oct. 2, 2014

(30) Foreign Application Priority Data
Mar. 26, 2013 (TW) .............................. 102110704 A

(51) Int. Cl.
*G01B 7/14* (2006.01)
*G01B 7/30* (2006.01)
(Continued)

(52) U.S. Cl.
CPC .................................... *G01R 33/098* (2013.01)

(58) Field of Classification Search
CPC ................. G01D 5/16; G01R 33/098
USPC .................. 324/51, 55, 200, 207.11, 207.13, 324/207.21, 252
See application file for complete search history.

(56) References Cited

U.S. PATENT DOCUMENTS 3,939,571 A   2/1976   Studdard
3,983,374 A   9/1976   Sorensen, III et al.
(Continued)

FOREIGN PATENT DOCUMENTS

CN   202149936   2/2012
EP   2527857   11/2012
(Continued)

OTHER PUBLICATIONS

Reig et al., "Magnetic Field Sensors Based on Giant Magnetoresistance (GMR) Technology: Applications in Electrical Current Sensing," Sensors, Oct. 12, 2009, pp. 7919-7942.
(Continued)

*Primary Examiner* — Jermele M Hollington
*Assistant Examiner* — Raul Rios Russo
(74) *Attorney, Agent, or Firm* — Jianq Chyun IP Office

(57) ABSTRACT

A 3-axis magnetic field sensor on a substrate and including, a first tunneling magneto-resistor (TMR) having a first easy-axis for sensing a X-axis magnetic field, a second TMR having a second easy-axis for sensing a Y-axis magnetic field, an out-of-plane magnetic sensor for sensing a Z-axis magnetic field, and a reference unit is provided. The first easy-axis and the second easy-axis are orthogonal and include an angle of 45±5 degrees with a bisection direction, respectively. The out-of-plane magnetic sensor includes a groove or bulge structure having a first incline and a second incline; a third TMR on the first incline having a third easy-axis; a fourth TMR on the second incline having a fourth easy-axis; and a central axis orthogonal to the bisection direction and parallel to the third easy-axis and the fourth easy-axis. The reference unit has a fifth TMR and a fifth easy-axis parallel to the bisection direction.

13 Claims, 15 Drawing Sheets

(51) Int. Cl.
  *G01R 33/06* (2006.01)
  *H01L 43/08* (2006.01)
  *G01R 33/09* (2006.01)

(56) References Cited

U.S. PATENT DOCUMENTS

| | | |
|---|---|---|
| 4,053,017 A | 10/1977 | Gill et al. |
| 4,081,033 A | 3/1978 | Bulger et al. |
| 4,104,997 A | 8/1978 | Padgitt |
| 4,183,078 A | 1/1980 | Kidd |
| 4,185,241 A | 1/1980 | Ewanus et al. |
| 4,213,503 A | 7/1980 | Elmberg et al. |
| 4,254,642 A | 3/1981 | Stokes |
| 4,258,953 A | 3/1981 | Johnson |
| 4,284,987 A | 8/1981 | Gibson et al. |
| 4,402,624 A | 9/1983 | Stahl et al. |
| 4,405,658 A | 9/1983 | Young |
| 4,431,896 A | 2/1984 | Lodetti |
| 4,497,117 A | 2/1985 | Wrobley et al. |
| 4,498,400 A | 2/1985 | Vorwerk et al. |
| 4,515,392 A | 5/1985 | Torras |
| 4,545,439 A | 10/1985 | Sellett et al. |
| 4,554,543 A | 11/1985 | Wyatt et al. |
| 4,561,188 A | 12/1985 | Williams et al. |
| 4,660,978 A | 4/1987 | Wu |
| 4,707,696 A | 11/1987 | Task et al. |
| 4,814,041 A | 3/1989 | Auda |
| 4,824,114 A | 4/1989 | Catalano |
| 4,889,241 A | 12/1989 | Cogan et al. |
| 4,901,695 A | 2/1990 | Kabasin et al. |
| 4,926,948 A | 5/1990 | Davidson et al. |
| 5,078,215 A | 1/1992 | Nau |
| 5,174,857 A | 12/1992 | Sung |
| 5,196,847 A | 3/1993 | Bateman |
| 5,271,024 A | 12/1993 | Huber |
| 5,356,238 A | 10/1994 | Musil et al. |
| 5,401,115 A | 3/1995 | Musil et al. |
| 5,409,566 A | 4/1995 | Kim |
| 5,416,048 A | 5/1995 | Blalock et al. |
| 5,440,923 A | 8/1995 | Arnberg et al. |
| 5,650,958 A | 7/1997 | Gallagher et al. |
| 5,801,984 A | 9/1998 | Parkin |
| 5,843,237 A | 12/1998 | Chun |
| 5,930,644 A | 7/1999 | Tsai et al. |
| 6,076,029 A | 6/2000 | Watanabe et al. |
| 6,127,045 A | 10/2000 | Gill |
| 6,137,135 A | 10/2000 | Kubo et al. |
| 6,155,759 A | 12/2000 | Fishburn |
| 6,157,032 A | 12/2000 | Into |
| 6,375,446 B1 | 4/2002 | Leonelli, Jr. |
| 6,382,621 B1 | 5/2002 | Inoue et al. |
| 6,408,105 B1 | 6/2002 | Maruo |
| 6,427,348 B1 | 8/2002 | Webb |
| 6,575,410 B2 | 6/2003 | Greene |
| 6,710,838 B2 | 3/2004 | Sakaki et al. |
| 6,927,942 B2 | 8/2005 | Tani et al. |
| 6,969,673 B2 | 11/2005 | Lee et al. |
| 6,994,615 B2 | 2/2006 | Easley et al. |
| 7,163,890 B2 | 1/2007 | Kang et al. |
| 7,233,719 B2 | 6/2007 | Okada et al. |
| 7,269,494 B2 | 9/2007 | Corigliano et al. |
| 7,352,177 B2 | 4/2008 | Lee et al. |
| 7,363,185 B2 | 4/2008 | Lee |
| 7,503,134 B2 | 3/2009 | Buckner |
| 7,532,504 B2 | 5/2009 | Saito |
| 7,534,720 B2 | 5/2009 | Kang et al. |
| 7,547,267 B1 | 6/2009 | Wang |
| 7,566,924 B2 | 7/2009 | Lee et al. |
| 7,585,775 B1 | 9/2009 | Bold et al. |
| 7,619,556 B1 | 11/2009 | McCusker |
| 7,635,974 B2 | 12/2009 | Guo et al. |
| 7,642,773 B2 | 1/2010 | Takahashi et al. |
| 7,775,114 B2 | 8/2010 | Twerdochlib et al. |
| 7,866,096 B2 | 1/2011 | Lee et al. |
| 7,876,073 B2 | 1/2011 | Sohma |
| 7,960,973 B2 | 6/2011 | Zeller et al. |
| 8,052,095 B2 | 11/2011 | Wilson et al. |
| 8,105,950 B2 | 1/2012 | Cho et al. |
| 8,134,361 B2* | 3/2012 | Azumi et al. ............... 324/252 |
| 8,242,776 B2* | 8/2012 | Mather et al. ............... 324/249 |
| 2002/0158168 A1 | 10/2002 | Greene |
| 2004/0031994 A1 | 2/2004 | Lee et al. |
| 2004/0251137 A1 | 12/2004 | Lee et al. |
| 2005/0054192 A1 | 3/2005 | Kang et al. |
| 2005/0073878 A1* | 4/2005 | Lin et al. ............... 365/158 |
| 2005/0114076 A1 | 5/2005 | Lee |
| 2005/0201668 A1 | 9/2005 | Neta |
| 2005/0210623 A1 | 9/2005 | Buckner |
| 2006/0027875 A1 | 2/2006 | Lee et al. |
| 2006/0215286 A1 | 9/2006 | Okada et al. |
| 2006/0219654 A1 | 10/2006 | Richter et al. |
| 2007/0082484 A1 | 4/2007 | Kang et al. |
| 2007/0083314 A1 | 4/2007 | Corigliano et al. |
| 2007/0089311 A1 | 4/2007 | Amundson et al. |
| 2007/0169552 A1 | 7/2007 | Shoji et al. |
| 2007/0205766 A1 | 9/2007 | Kou |
| 2007/0290682 A1 | 12/2007 | Oohira et al. |
| 2008/0188717 A1 | 8/2008 | Chen et al. |
| 2008/0222973 A1 | 9/2008 | Lee et al. |
| 2008/0230516 A1 | 9/2008 | Cho et al. |
| 2008/0308681 A1 | 12/2008 | Wilson et al. |
| 2008/0309157 A1 | 12/2008 | Runggaldier et al. |
| 2009/0015251 A1 | 1/2009 | Azumi et al. |
| 2009/0027048 A1 | 1/2009 | Sato et al. |
| 2009/0078051 A1 | 3/2009 | Twerdochlib et al. |
| 2009/0218688 A1 | 9/2009 | Ayotte et al. |
| 2009/0243607 A1 | 10/2009 | Mather et al. |
| 2010/0038291 A1 | 2/2010 | Sauser |
| 2010/0050651 A1 | 3/2010 | Dindar et al. |
| 2010/0073185 A1 | 3/2010 | Uchiyama et al. |
| 2010/0117077 A1 | 5/2010 | Yamazaki et al. |
| 2010/0276389 A1 | 11/2010 | Mather et al. |
| 2010/0314520 A1 | 12/2010 | Collmar |
| 2011/0106477 A1 | 5/2011 | Brunner |
| 2011/0244599 A1 | 10/2011 | Whig et al. |
| 2012/0068698 A1 | 3/2012 | Chen et al. |
| 2013/0168788 A1 | 7/2013 | Wang et al. |

FOREIGN PATENT DOCUMENTS

| | | |
|---|---|---|
| TW | 497120 | 8/2002 |
| TW | I269867 | 1/2007 |
| TW | 200741799 | 11/2007 |
| TW | 201213833 | 4/2012 |

OTHER PUBLICATIONS

Marina Diaz-Michelena, "Small Magnetic Sensors for Space Applications," Sensors, Mar. 30, 2009, pp. 2271-2288.

Shah et al., "Magnetic tunneling junction based magnetic field sensors: Role of shape anisotropy versus free layer thickness," Journal of Applied Physics, Apr. 8, 2011, vol. 109, pp. 07C731.

Ferreira et al., "2-Axis Magnetometers Based on Full Wheatstone Bridges Incorporating Magnetic Tunnel Junctions Connected in Series," IEEE Transactions on Magnetics, Nov. 2012, vol. 48, No. 11., pp. 4107-4110.

Chen et al., "Tunable linear magnetoresistance in MgO magnetic tunnel junction sensors using two pinned CoFeB electrodes," Applied Physics Letters, Apr. 4, 2012, vol. 100, pp. 142407.

Kwon et al., "Fine ZnO Patterning With Controlled Sidewall-Etch Front Slope", Journal of Microelectromechanical Systems, June 2005, vol. 14, No. 3, pp. 603-609.

Campbell et al., "Final CD control through slope/sidewall angle correlation with stepper defocus and electrical parametric", Proceedings of SPIE, Process and Equipment Control in Microelectronic Manufacturing II, Apr. 20, 2001, vol. 4405, pp. 91-99.

Kal et al., "Slope Etching of Silicon Dioxide", Microelectron. Reliab., Jul. 1989, vol. 30, No. 4, pp. 719-722.

Abraham-Shrauner, "Plasma etch profiles of passivated open-area trenches", Journal of Vacuum Science and Technology B, Mar. 2001, vol. 19, pp. 711-721.

(56) References Cited

OTHER PUBLICATIONS

Collard et al., "Examination of various endpoint methods for chrome mask etch", Proceedings of SPIE, 23rd Annual BACUS Symposium on Photomask Technology, Dec. 15, 2003, vol. 5256, pp. 744-748.

Zhang et al., "Microfabrication and test of a magnetic field sensor using electrodeposited thin film of giant magnetoresistive (Cu/Co)x multilayers," Microsystem Technologies, Sep. 2003, vol. 9, Issue 6-7, pp. 436-440.

Lohndorf et al., "Strain Sensors Based on Magnetostrictive GMR/TMR Structures," IEEE Transactions on Magnetics, Sep. 2002, vol. 38, No. 5, pp. 2826-2828.

Fujiwara et al., "Fabrication of Magnetic Tunnel Junctions with a Synthetic Ferrimagnetic Free Layer for Magnetic Field Sensor Applications," Japanese Journal of Applied Physics, Jan. 20, 2011, vol. 50, pp. 013001.

Wang et al., "70% TMR at Room Temperature for SDT Sandwhich Junctions With CoFeB as Free and Reference Layers," IEEE Transactions on Magnetics, Jul. 2004, vol. 40, No. 4, pp. 2269-2271.

Presson et al., "Etch-stop technique for patterning of tunnel junctions for a magnetic field sensor," Journal of Micromechanics and Microengineering, Mar. 10, 2011, pp. 1-8.

Cheng-Wei Chien et al., "Magnetic Sensing Apparatus and Manufacturing Method Thereof", Unpublished U.S. Appl. No. 13/851,097, filed Mar. 26, 2013.

"Office Action of Taiwan Counterpart Application," issued on Apr. 27, 2015, pp. 1-6.

* cited by examiner

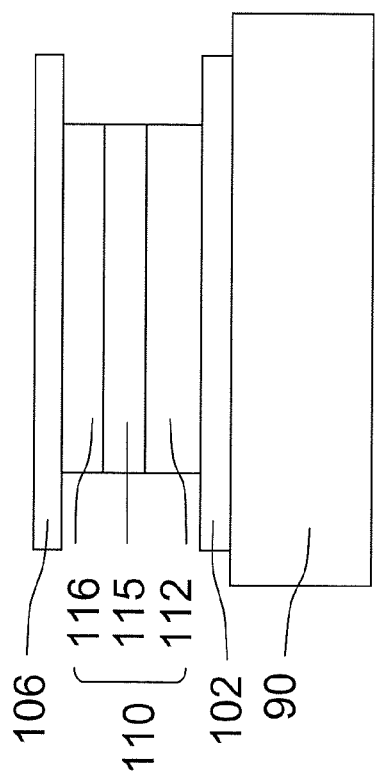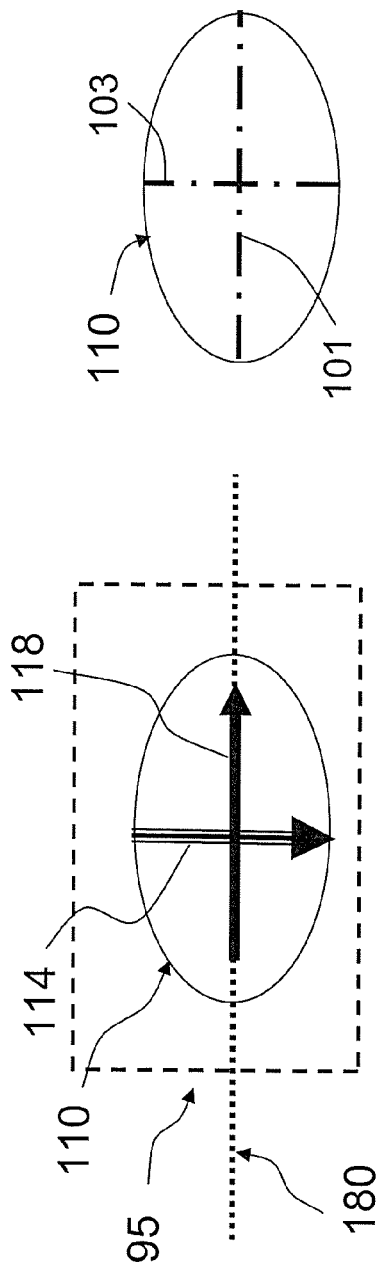
FIG.1A
FIG.1B

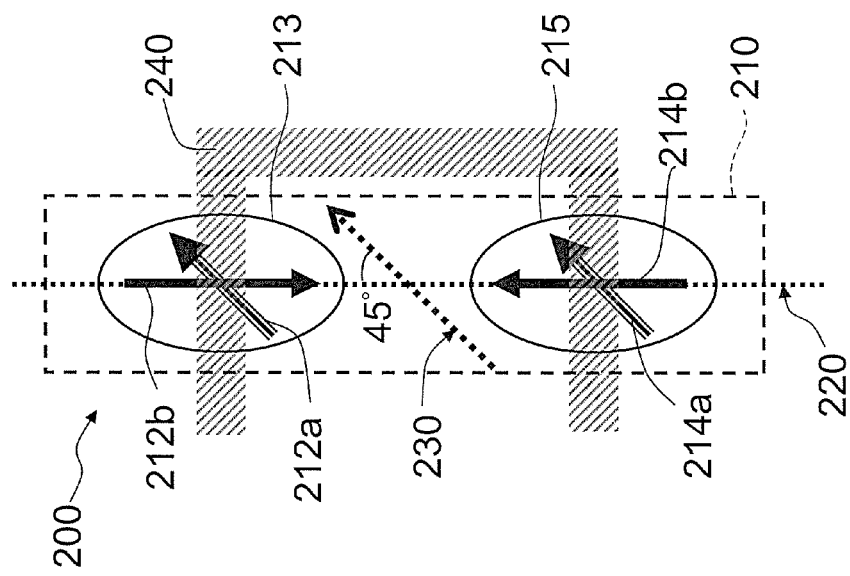

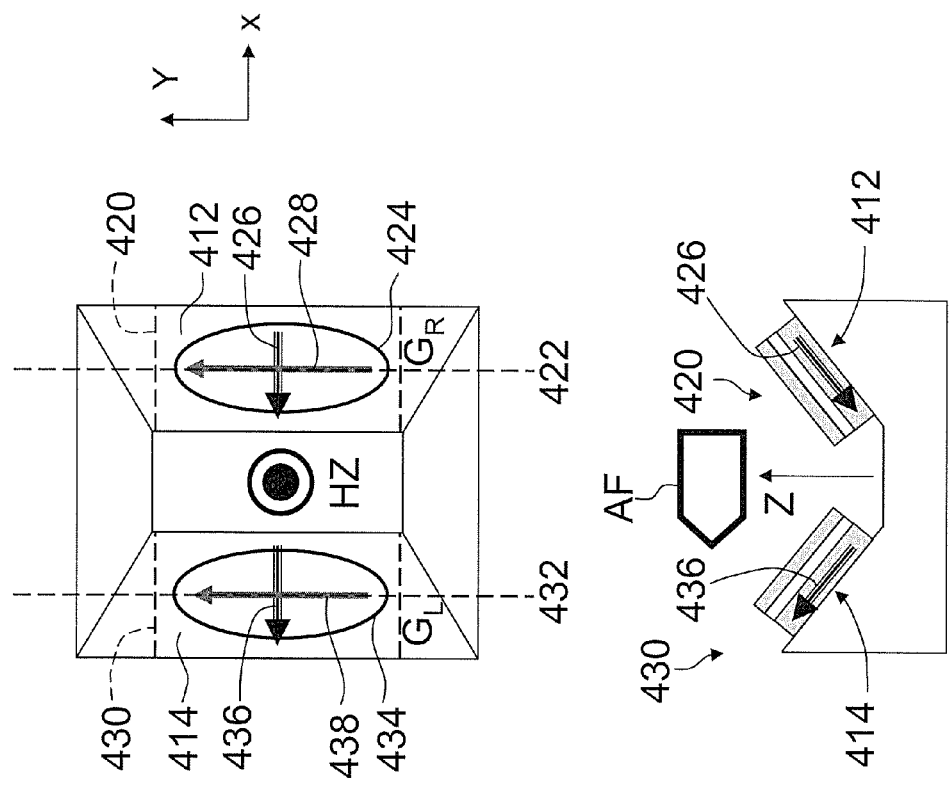

3-AXIS MAGNETIC FIELD SENSOR, METHOD FOR FABRICATING MAGNETIC FIELD SENSING STRUCTURE AND MAGNETIC FIELD SENSING CIRCUIT

CROSS-REFERENCE TO RELATED APPLICATION

This application claims the priority benefit of Taiwan application serial no. 102110704, filed on Mar. 26, 2013. The entirety of the above-mentioned patent application is hereby incorporated by reference herein and made a part of this specification.

TECHNICAL FIELD

The disclosure relates to a magnetic field sensing device, and relates to a single-chip integrated 3-axis magnetic field sensor used as an electronic compass.

BACKGROUND

Electronic compasses have been widely used in various electronic devices to improve performance thereof. For example, the electronic compass can be used in a global positioning system (GPS) to improve sensing capability. An advancing direction in the GPS is determined through movement of an object. However, when the object has a low speed, or is in a static state, the GPS cannot accurately orientation the object. The electronic compass can provide azimuth information to help determining the direction.

Various mechanisms of sensing a magnetic field have been provided, for example, a typical Hall device or a magneto-resistance device. The magneto-resistance device includes an anisotropic magneto-resistor (AMR), a giant magneto-resistor (GMR) and a tunneling magneto-resistor (TMR), which have higher sensitivity than that of the Hall device, and the back-end process is easy to be integrated with the front-end process of a complementary metal oxide semiconductor (CMOS).

The AMR magnetic field sensor has been commercialized, though it is limited to a 2-axis integrated chip type. The AMR may use 45 degree of shorting bars, so-called Barber pole bias structure, and work in a bipolar mode. The GMR has a larger magneto-resistance ratio (MR) than that of the AMR, though the GMR is hard to operate under the bipolar mode, and generally uses a unipolar mode to sense magnitude of the magnetic field. In recent years, implementation of the TMR with high magneto-resistance ratio draws greater attention, and only few single-axis magnetic field sensor products are produced for sale. Unexpectedly, the characteristics of the TMR and magnetic thin film limit feasibility of multi-axis magnetic field sensors thereof.

FIG. 1A and FIG. 1B are schematic diagrams of a typical TMR applied to a magnetic field sensor 95, which includes a bottom electrode 102 formed on a substrate 90, wherein a bottom plate formed by conductive metal serves as the bottom electrode 102; a magnetic tunneling junction (MTJ) device 110 formed on the bottom electrode 102; and a top electrode 106 formed on the MTJ device 110, wherein a top plate formed by conductive material serves as the top electrode 106. Cross lines intersected at a center can be defined from a structure pattern of the MTJ device, wherein a longer line thereof is referred to as a major axis 101, and a shorter line referred to as a minor axis 103. Moreover, a line referred to as an easy-axis 180 is collinear with the major axis 101. The MTJ device 110 includes a pinned layer 112, a tunneling layer 115 and a free layer 116, wherein the MTJ device 110 is disposed between the bottom electrode 102 and the top electrode 106. The pinned layer 112 of a magnetic material is formed on the bottom electrode 102, and has a pinned magnetization 114 parallel to a pinned direction. The tunneling layer 115 of a non-magnetic material is formed on the pinned layer 112. The free layer 116 of the magnetic material is formed on the tunneling layer 115, and has a free magnetization 118, being initially parallel to the easy-axis 180.

After the MTJ device 110 is formed, for example, after magnetic thin film stacking and pattern etching, a magnetic field with a direction orthogonal to the easy-axis 180 is exerted during an annealing process. After the annealing process, the pinned magnetization 114 will be parallel to the direction of the applied magnetic field, and shape anisotropy of the MTJ device 110 makes the free magnetization 118 tend to be parallel to the easy-axis 180. Therefore, the magnetic field sensing direction of the TMR is orthogonal to the easy-axis 180 on the substrate after annealing process. Moreover, a magnetic film layer of a horizontally polarized material generally has an extremely strong demagnetization field, which confine the activities of magnetizations of the free layer and the pinned layers, all of which are in-plane of the magnetic film. Namely, the magnetizations are hard to stand on the horizontal plane but easy to rotate on the horizontal plane of the magnetic thin film. Therefore, the typical structure of the TMR is only adapted to an in-plane magnetic field sensor.

Due to the limitation of the magnetic thin film, if the magneto-resistor is used to sense the magnetic field with the direction orthogonal to the substrate, the magneto-resistor is generally fabricated on an incline of the substrate to sense a component of the magnetic field on the incline. A challenge of the AMR lies in that it requires a large incline area, and lithography and etching process of the screw pattern bar pole of 45 degrees is a great challenge. The direction of the pinned magnetization of the TMR is limited by the direction of the magnetic field of the annealing process, and integrated multi-axis magnetic field sensor cannot be fabricated.

The electronic compass is generally required to sense components of geomagnetic field on X-Y-Z directions. So far, a conventional electronic compass chip generally includes two or three 2-axis/single-axis magnetic field sensors to respectively sense the component of the geomagnetic field on each direction. Therefore, how to design a 3-axis integrated and low-cost magnetic field sensor is always a very popular topic in the field.

SUMMARY

The disclosure provides a 3-axis magnetic field sensor including a first in-plane magnetic field sensor, a second in-plane magnetic field sensor, an out-of-plane magnetic field sensor and a tunneling magneto-resistance reference unit. The first in-plane magnetic field sensor is located on a substrate to sense an X-axis magnetic field, and has a first tunneling magneto-resistor (TMR) and a first easy-axis, wherein the first easy-axis is regarded as a Y-axis. The second in-plane magnetic field sensor is located on the substrate to sense a Y-axis magnetic field, and has a second TMR and a second easy-axis, wherein the second easy-axis is regarded as an X-axis. An included angle between the first easy-axis and the second easy-axis is 90±10 degrees, and a bisection direction on the substrate respectively includes an angle of 45±5 degrees with the first easy-axis and the second easy-axis. The out-of-plane magnetic field sensor is located on the substrate to sense a Z-axis magnetic field. The out-of-plane magnetic field sensor includes a groove or bulge structure, a third TMR and a fourth TMR. The groove or bulge structure is located on the substrate and has a first incline, a second incline and a central axis, wherein the first incline and the second incline have a same bevel angle relative to the substrate and are symmetric relative to the central axis, and the central axis is orthogonal to the bisection direction. The third TMR is formed on the first incline and has a third easy-axis, and the fourth TMR is formed on the second incline and has a fourth easy-axis, wherein the third easy-axis and the fourth easy-axis are parallel to the central axis. The tunneling magneto-resistance reference unit is located on the substrate and have a fifth TMR and a fifth easy-axis, wherein the fifth easy-axis is parallel to the bisection direction.

The disclosure provides a method for fabricating a magnetic field sensing structure, wherein the magnetic field sensing structure is the aforementioned 3-axis magnetic field sensor. The method includes applying a single annealing magnetic field on the 3-axis magnetic field sensor, wherein a direction of the single annealing magnetic field is parallel to an X-Y plane, and respectively include an angle of 45±5 degrees with the first easy-axis and the second easy-axis, and is orthogonal to the third easy-axis and the fourth easy-axis, and is parallel to the fifth easy-axis.

The disclosure provides a magnetic field sensing circuit, which is configured to convert a magnetic field sensed by a magnetic field sensor into an electronic signal. The magnetic field sensing circuit includes a magnetic field sensor and a voltage clamped signal transfer amplifier. The magnetic field sensor is the aforementioned out-of-plane magnetic field sensor. The voltage clamped signal transfer amplifier has a positive input terminal, an output terminal, a negative input terminal and a resistor, wherein the resistor is connected between the output terminal and the negative input terminal. One end of the third TMR is connected to one end of the fourth TMR and is connected to the negative input terminal. The other end of the third TMR is connected to a power. The other end of the fourth TMR is connected to ground. The positive input terminal is connected to a midpoint voltage source.

The invention provides a magnetic field sensing circuit, which is configured to convert a magnetic field sensed by a magnetic field sensor into an electronic signal. The magnetic field sensing circuit includes a magnetic field sensor, a voltage clamped signal transfer amplifier and a tunneling magneto-resistance reference unit. The magnetic field sensor is the aforementioned first in-plane magnetic field sensor or the second in-plane magnetic field sensor. The voltage clamped signal transfer amplifier has a positive input terminal, an output terminal, a negative input terminal and a resistor, wherein the positive input terminal is connected to a midpoint voltage source, and the resistor is connected between the output terminal and the negative input terminal. One end of the tunneling magneto-resistance reference unit is connected to the magnetic field sensor, and is connected to the negative input terminal. The other end of the tunneling magneto-resistance reference unit is connected to a power, and the other end of the magnetic field sensor that is not connected to the tunneling magneto-resistance reference unit is connected to ground.

The invention provides a magnetic field sensing circuit, which is configured to convert a magnetic field sensed by a 3-axis magnetic field sensor into an electronic signal. The magnetic field sensing circuit includes a voltage clamped signal transfer amplifier, a magnetic field sensor, and a tunneling magneto-resistance reference unit. The voltage clamped signal transfer amplifier has a positive input terminal, an output terminal, a negative input terminal and a resistor, wherein the positive input terminal is connected to a midpoint voltage source, and the resistor is connected between the output terminal and the negative input terminal. The magnetic field sensor is the aforementioned out-of-plane magnetic field sensor, the first in-plane magnetic field sensor or the second in-plane magnetic field sensor. One end of the third TMR is connected to one end of the fourth TMR and is connected to the negative input terminal. The other end of the third TMR is connected to a power. The other end of the fourth TMR is connected to ground. One end of the tunneling magneto-resistance reference unit is connected to the first in-plane magnetic field sensor or the second in-plane magnetic field sensor, and is connected to the negative input terminal. The other end of the first in-plane magnetic field sensor or the second in-plane magnetic field sensor that is not connected to the tunneling magneto-resistance reference unit is connected to ground.

The invention provides a magnetic field sensing circuit, which is configured to convert a magnetic field sensed by a 3-axis magnetic field sensor into an electronic signal. The magnetic field sensing circuit includes an operational amplifier, a magnetic field sensor, a first tunneling magneto-resistance reference unit, a second tunneling magneto-resistance reference unit and a third tunneling magneto-resistance reference unit. The operational amplifier has a positive input terminal, an output terminal and a negative input terminal, wherein the positive input terminal is connected to a voltage source. The magnetic field sensor is the aforementioned out-of-plane magnetic field sensor, the first in-plane magnetic field sensor or the second in-plane magnetic field sensor. The first tunneling magneto-resistance reference unit has a first terminal and a second terminal, wherein the first terminal is connected to a power. The second tunneling magneto-resistance reference unit has a third terminal and a fourth terminal, wherein the fourth terminal is connected to the output terminal. One end of the first in-plane magnetic field sensor or the second in-plane magnetic field sensor is connected to ground, and the other end thereof is connected to the second terminal, the third terminal and the negative input terminal. The third tunneling magneto-resistance reference unit has a fifth terminal and a sixth terminal, wherein the fifth terminal is connected to the negative input terminal, and the sixth terminal is connected to the output terminal. One end of the third TMR is connected to one end of the fourth TMR and is connected to the fifth terminal and the negative input terminal. The other end of the third TMR is connected to the power. The other end of the fourth TMR is connected to the ground.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 1A and FIG. 1B are schematic diagrams of a typical tunneling magneto-resistor (TMR) applied to a magnetic field sensor 95.

FIG. 4A and FIG. 4B are schematic diagrams of a 2-axis in-plane magnetic field sensor according to an embodiment of the disclosure.

FIG. 8A and FIG. 8B are respectively a top view and a cross-sectional view of a Z-axis out-of-plane magnetic field sensor.

DETAILED DESCRIPTION OF DISCLOSED EMBODIMENTS

Figure 2:
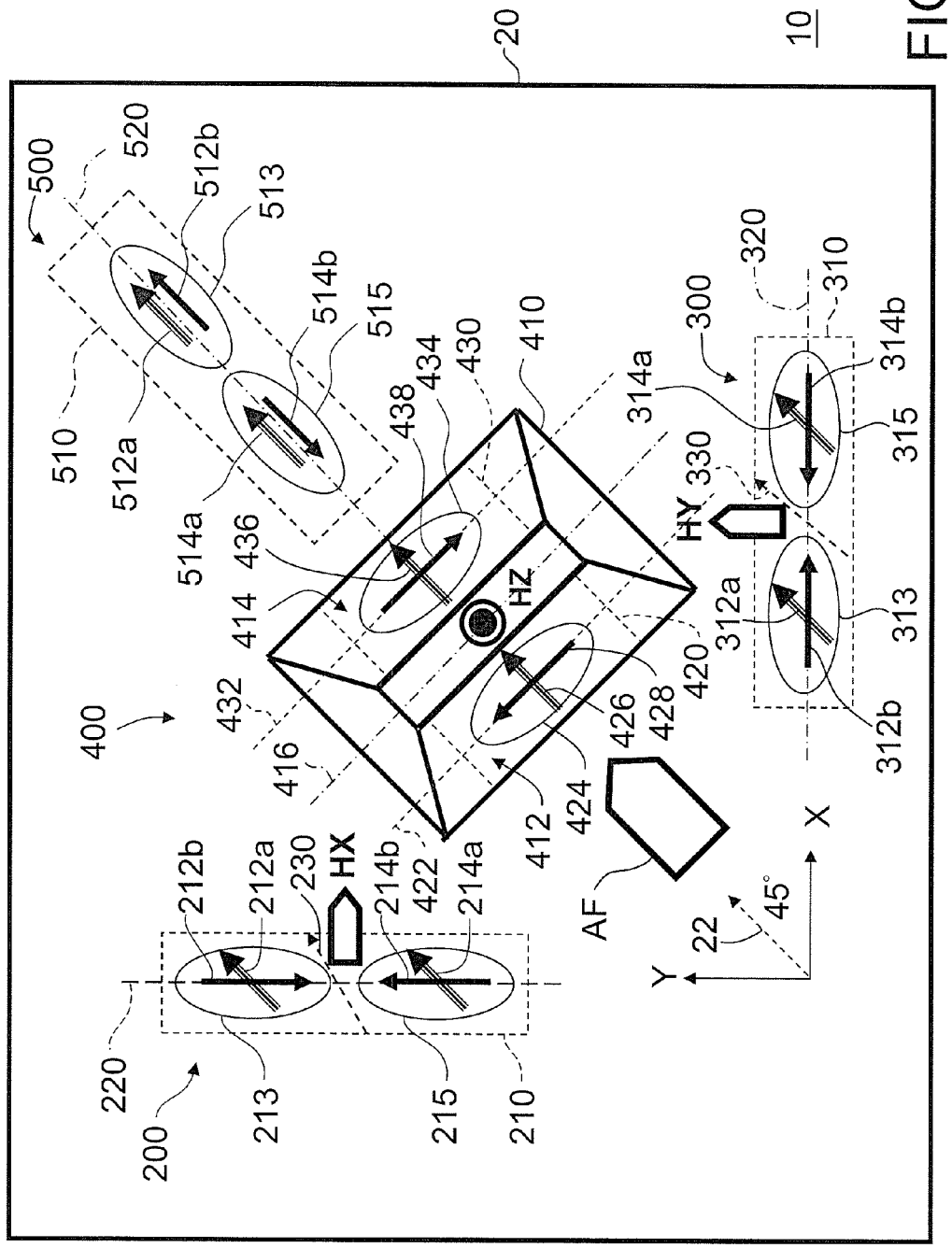
FIG. 2 and FIG. 3 are respectively schematic diagrams of a 3-axis magnetic field sensor viewing from different viewing angles according to an embodiment of the disclosure.
Figure 3:
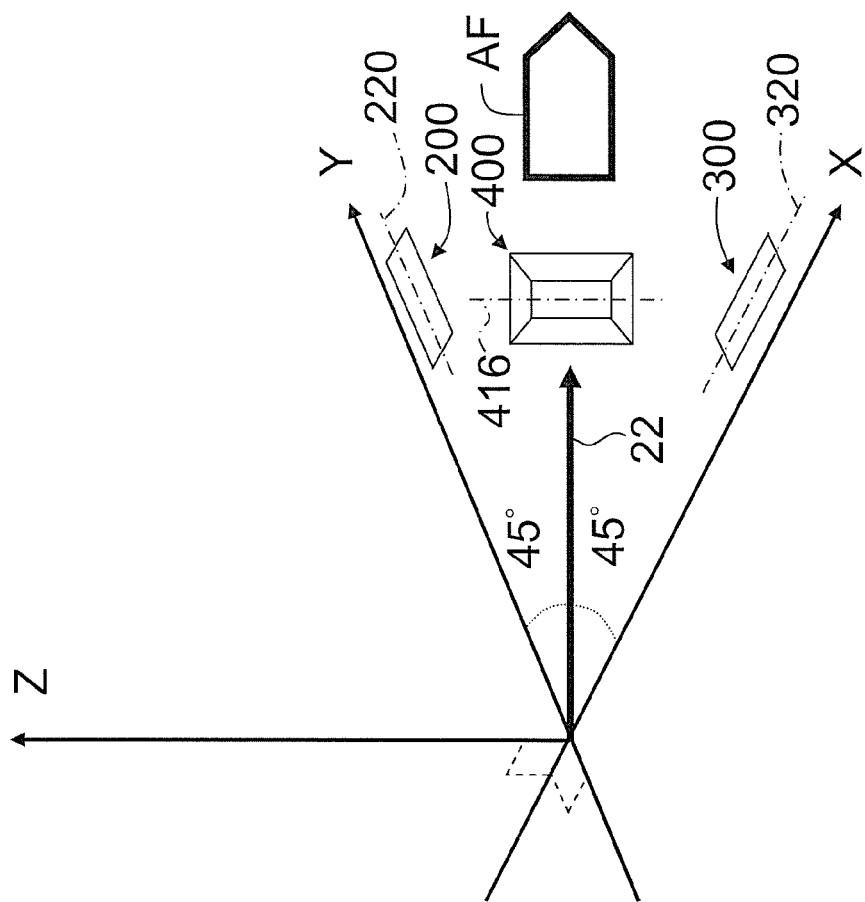

FIG. 2 and FIG. 3 are respectively schematic diagrams of a 3-axis magnetic field sensor viewing from different viewing angles according to an embodiment of the disclosure, which is also used to describe a method of applying a single magnetic field on the 3-axis magnetic field sensor in a single annealing process to set a pinned direction of each tunneling magneto-resistor. Referring to FIG. 2 and FIG. 3, in the embodiment, the 3-axis integrated magnetic field sensor 10 includes a 2-axis in-plane magnetic field sensor, a Z-axis out-of-plane magnetic field sensor 400 and a tunneling magneto-resistance reference unit 500. The 2-axis in-plane magnetic field sensor includes a first in-plane magnetic field sensor 200 and a second in-plane magnetic field sensor 300, wherein the first in-plane magnetic field sensor 200 is located on a substrate 20 to sense an X-axis magnetic field (HX), and has a first tunneling magneto-resistor (TMR) 210 and a first easy-axis 220, wherein the first easy-axis 220 is regarded as a Y-axis. The second in-plane magnetic field sensor 300 is located on the substrate 20 to sense a Y-axis magnetic field (HY), and has a second TMR 310 and a second easy-axis 320, wherein the second easy-axis 320 is regarded as an X-axis. Moreover, in the aforementioned structure, an included angle between the first easy-axis 220 and the second easy-axis 320 is 90±10 degrees, and a bisection direction 22 on the substrate 20 respectively includes an angle of 45±5 degrees with the first easy-axis 220 and the second easy-axis 320.

Moreover, the out-of-plane magnetic field sensor 400 is located on the substrate 20 to sense a Z-axis magnetic field (HZ). The out-of-plane magnetic field sensor 400 includes a groove or bulge structure 410, a third TMR 420 and a fourth TMR 430, wherein the groove or bulge structure 410 is located on the substrate 20 and has a first incline 412, a second incline 414 and a central axis 416. The first incline 412 and the second incline 414 have a same bevel angle relative to the substrate 20 and are symmetric relative to the central axis 416, and the central axis 416 is orthogonal to the bisection direction 22. The third TMR 420 is formed on the first incline 412 and has a third easy-axis 422. The fourth TMR 430 is formed on the second incline 414 and has a fourth easy-axis 432, wherein the third easy-axis 422 and the fourth easy-axis 432 are parallel to the central axis 416. The tunneling magneto-resistance reference unit 500 is located on the substrate 20 and have a fifth TMR 510 and a fifth easy-axis 520, wherein the fifth easy-axis 520 is parallel to the bisection direction 22.

Figure 4B:
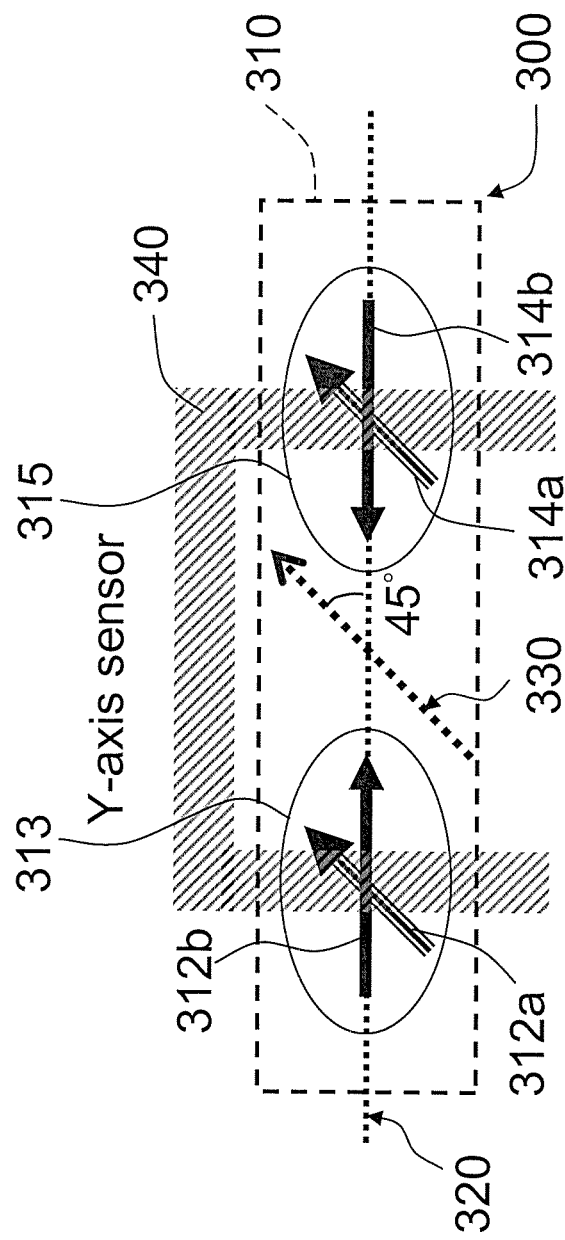

In detail, FIG. 4A and FIG. 4B are schematic diagrams of a 2-axis in-plane magnetic field sensor according to an embodiment of the disclosure. The first in-plane magnetic field sensor 200 further has a first pinned direction 230 and a first metal wire path 240, and the first metal wire path 240 is disposed on the top or bottom of the first TMR 210. For clarity's sake, the aforementioned (and the follow-up) metal wire path is omitted in FIG. 2. The second in-plane magnetic field sensor 300 further has a second pinned direction 330 and a second metal wire path 340, and the second metal wire path 340 is disposed on the top or bottom of the second TMR 310. The first pinned direction 230 and the second pinned direction 330 are all parallel to the bisection direction 22 of the substrate 20 (i.e. the coordinate system in the figure), and have an included angle of 45 degrees relative to the X-axis and the Y-axis on the substrate 20.

The first TMR 210 includes a first magnetic tunneling junction (MTJ) device 213 having a first pinned magnetization 212a and a first free magnetization 212b, and a second MTJ device 215 having a second pinned magnetization 214a and a second free magnetization 214b. The first pinned magnetization 212a and the second pinned magnetization 214a are all parallel to the first pinned direction 230. The first free magnetization 212b and the second free magnetization 214b are initially parallel to the first easy-axis 220 and are anti-parallel to each other. The second TMR 310 includes a third MTJ device 313 having a third pinned magnetization 312a and a third free magnetization 312b, and a fourth MTJ device 315 having a fourth pinned magnetization 314a and a fourth free magnetization 314b. The third pinned magnetization 312a and the fourth pinned magnetization 314a are parallel to the second pinned direction 330. The third free magnetization 312b and the fourth free magnetization 314b are initially parallel to the second easy-axis 320 state and are anti-parallel to each other.

Figure 5:
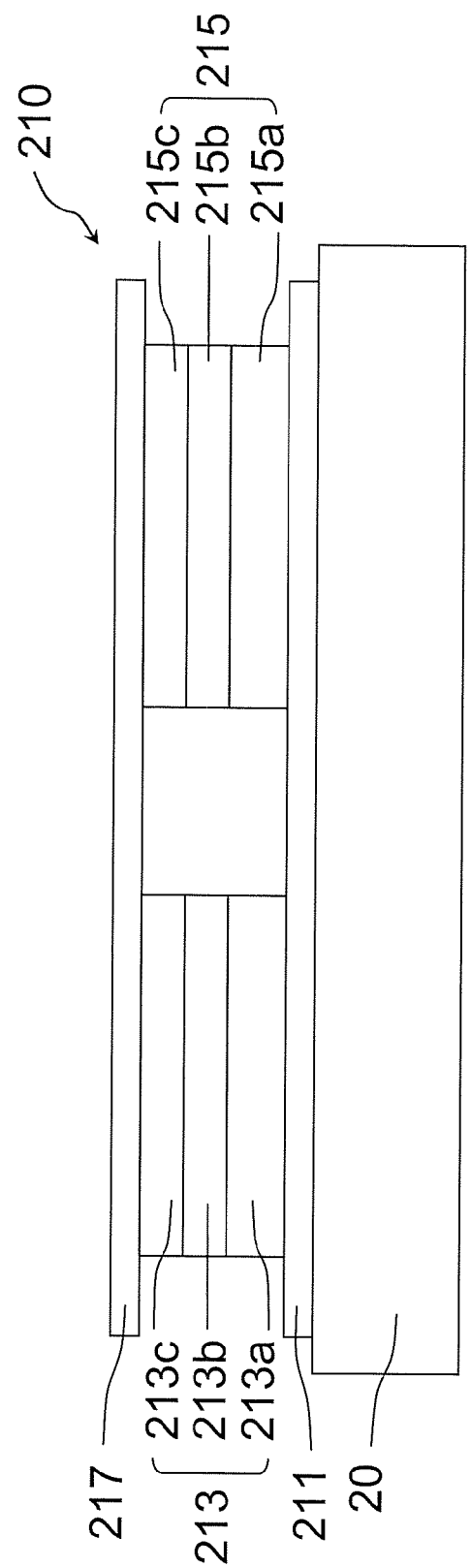
FIG. 5 is a cross-sectional view of an in-plane magnetic field sensor along an easy-axis according to an embodiment of the disclosure.

Further, the 2-axis in-plane magnetic field sensors have the same structure. FIG. 5 is a cross-sectional view of an in-plane magnetic field sensor along an easy-axis according to an embodiment of the disclosure, which is used to describe a detailed structure of one of the in-plane magnetic field sensors. Referring to FIG. 5 and FIG. 4A and FIG. 4B, in the first TMR 210, a first bottom electrode 211 located on the substrate 20 and a first top electrode 217 are used as terminals of circuit connection to connect the first MTJ device 213 and the second MTJ device 215 in parallel.

The first MTJ device 213 includes a first pinned layer 213a of a magnetic material, a first tunneling layer 213b of a non-magnetic material and a first free layer 213c of the magnetic material. The first pinned layer 213a is located on the first bottom electrode 211 and has the first pinned magnetization 212a parallel to the first pinned direction 230. The first tunneling layer 213b is disposed on the first pinned layer 213a. The first free layer 213c is disposed on the first tunneling layer 213b and has the first free magnetization 212b parallel to the first easy-axis 220, wherein a first included angle is formed between the first pinned direction 230 and the first easy-axis 220.

The second MTJ device 215 has a same pattern and magnetic thin film stack with that of the first MTJ device 213, and includes a second pinned layer 215a of the magnetic material, a second tunneling layer 215b of the non-magnetic material and a second free layer 215c of the magnetic material. The second pinned layer 215a is located on the first bottom electrode 211 and has the second pinned magnetization 214a parallel to the first pinned direction 230. The second tunneling layer 215b is disposed on the second pinned layer 215a. The second free layer 215c is disposed on the second tunneling layer 215b and has the second free magnetization 214b parallel to the first easy-axis 220. The first top electrode 217 is connected to the first free layer 213c and the second free layer 215c. The first free magnetization 212b and the second free magnetization 214b are initially parallel to the first easy-axis 220 and are anti-parallel to each other. The first included angle between the first pinned direction 230 and the first easy-axis 220 is substantially 45±5 degrees or 135±5 degrees, wherein the first magnetic field sensing direction is orthogonal to the first easy-axis 220 of the first in-plane magnetic field sensor 200 on the substrate 20.

The first bottom electrode 211 and the first top electrode 217 are respectively formed by a conductive material (for example, Ta, Ti, TiN, TaN, Al, Cu, or Ru, etc.) on the substrate 20. The pinned layer is formed by a magnetic material such as NiFe, CoFe, or CoFeB, etc. The tunneling layer is formed by a non-magnetic material such as AlO or MgO, etc.

The first metal wire path 240 crosses over the first MTJ device 213 and the second MTJ device 215, and a set current $I_{SET}$ can be applied thereto to produce a magnetic field. The magnetic fields applied on the first MTJ device 213 and the second MTJ device 215 are all parallel to the first easy-axis 220 and have opposite directions, such that the first free magnetization 212b and the second free magnetization 214b are set to be anti-parallel.

Figure 6:
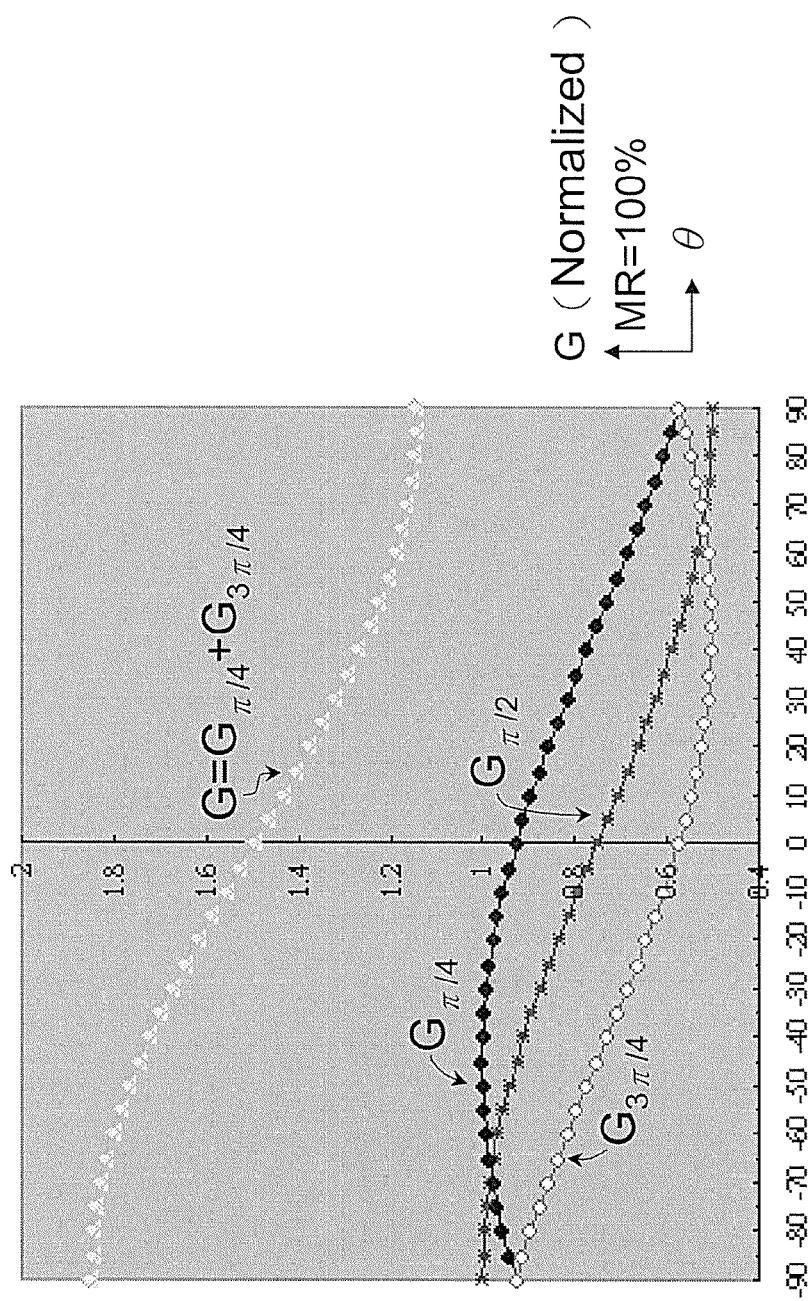
FIG. 6 is the calculated normalized conductivity of an in-plane magnetic field sensor with applied magnetic field, in which the conductivity of a typical TMR is also shown for reference.

According to the above disclosure, the conductivity of the first TMR 210 can be obtained according to an equation (1). FIG. 6 is the calculated normalized conductivity of the first TMR 210 with applied magnetic field, in which the conductivity of the typical TMR 95 is also shown for reference.

$$G = G_{\frac{\pi}{4}} + G_{\frac{3\pi}{4}} = G_P \left[ 1 + \frac{1 - \frac{MR}{\sqrt{2}} \times \sin\theta}{1 + MR} \right] \quad (1)$$

$$G_{\frac{\pi}{4}} = \frac{G_P}{2}\left[1 + \frac{1 + MR\cos(\frac{\pi}{4} + \theta)}{1 + MR}\right] = \frac{G_P}{2}\left[1 + \frac{1 + \frac{MR}{\sqrt{2}}(\cos\theta - \sin\theta)}{1 + MR}\right]. \quad (2)$$

$$G_{\frac{3\pi}{4}} = \quad (3)$$
$$\frac{G_P}{2}\left[1 + \frac{1 + MR\cos(\frac{3\pi}{4} + \theta)}{1 + MR}\right] = \frac{G_P}{2}\left[1 + \frac{1 + \frac{MR}{\sqrt{2}}(-\cos\theta - \sin\theta)}{1 + MR}\right].$$

The equation (2) and the equation (3) are respectively the conductivity of the first MTJ device 213 and the second MTJ device 215. The first MTJ device 213 and the second MTJ device 215 are assumed to have the same material parameter, wherein MR is a magneto-resistance ratio, $G_P$ is the conductivity when the free layer magnetic moment is parallel to the pinned layer magnetic moment, and $\theta$ is an included angle between the free magnetization and the easy-axis when the applied magnetic field $H_\perp$(HX) is orthogonal to the easy-axis.

It is assumed that the applied magnetic field is smaller than a coercivity $H_C$ of the MTJ device, and $$\sin\theta \cong \frac{H_\perp}{H_C}.$$

As shown in a following equation (4), the conductivity of the first TMR 210 and the applied magnetic field have a linear relationship.

$$G = G_P\left[1 + \frac{1 - \frac{MR}{\sqrt{2}} \frac{H_\perp}{H_C}}{1 + MR}\right]. \quad (4)$$

Figure 7A:
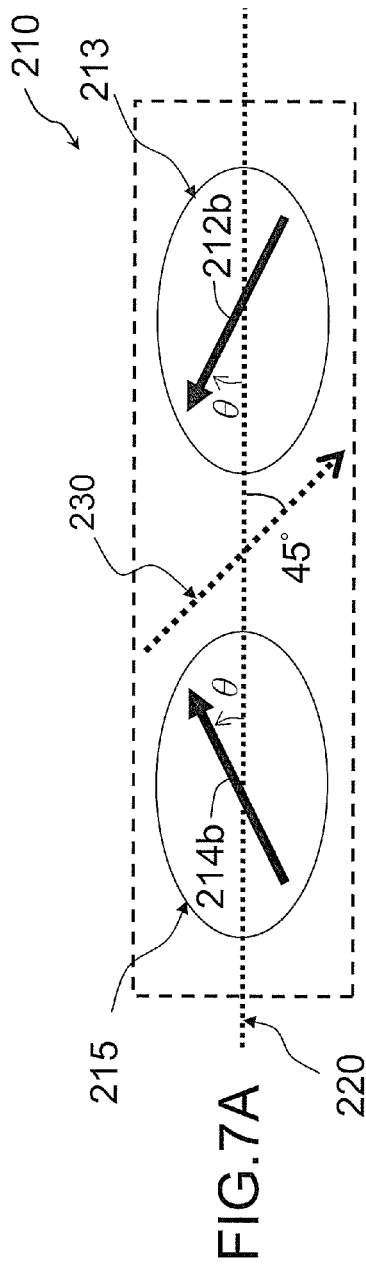
FIG. 7A and FIG. 7B are the micro-magnetism simulations of an in-plane magnetic field sensor according to an embodiment of the disclosure.
Figure 7B:
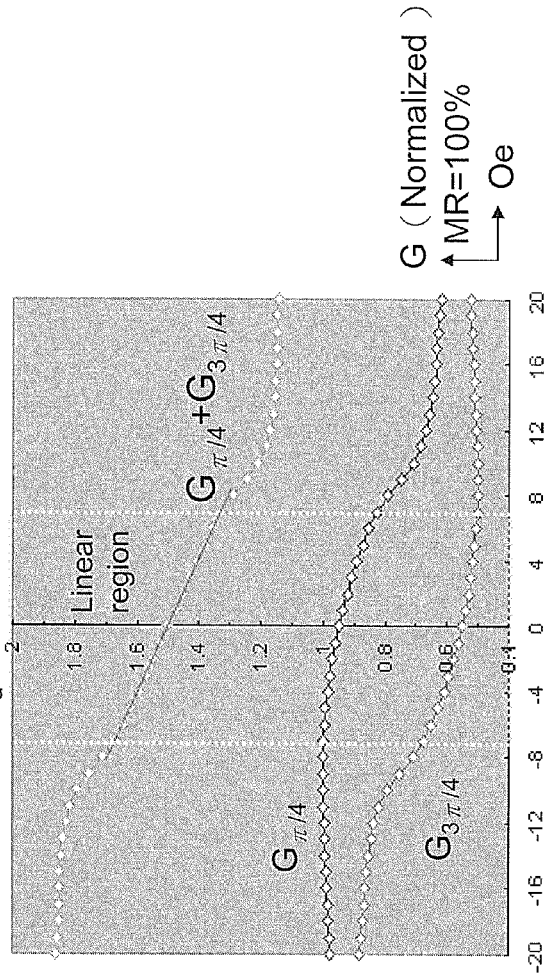

FIG. 7A and FIG. 7B are micro-magnetism simulations of the first TMR 210, which proves the linear relationship between the conductivity thereof and the applied magnetic field, in which the first MTJ device 213 and the second MTJ device 215 have a same oval shape (with a major axis of 2 μm and a minor axis of 1 μm) and a same thickness 10 Å of free layers, and a saturation magnetization of the free layer is MS=1000 emu/cc, and an anisotropy constant of the pinned layer is Ku=800 erg/cc. In one embodiment, the conductivity of the first TMR 210 is linearly decreased as the applied magnetic field is increased. When the direction of the first pinned direction 230 is reversed, the conductivity is linearly increased.

FIG. 8A and FIG. 8B are respectively a top view and a cross-sectional view of a Z-axis out-of-plane magnetic field sensor. The out-of-plane magnetic field sensor 400 is composed of the third TMR 420 formed on the first incline 412 and connected in series with the fourth TMR 430 formed on the second incline 414, wherein the third TMR 420 has a fifth MTJ device 424, and the fourth TMR 430 has a sixth MTJ device 434. The fifth MTJ device 424 and the sixth MTJ device 434 have a same pattern and have a same structure with that of the MTJ device 110 of the typical TMR 95 in FIG. 1A and FIG. 1B. The third TMR 420 and the fourth TMR 430 have the same magnetic thin film stack with that of the TMR of the in-plane magnetic field sensor. Moreover, the third TMR 420 has a fifth free magnetization 428 parallel to the third easy-axis 422, and has a fifth pinned magnetization 426 along the first incline 412 and orthogonal to the third easy-axis 422. Similarly, the fourth TMR 430 has a sixth free magnetization 438 parallel to the fourth easy-axis 432, and has a sixth pinned magnetization 436 along the second incline 414 and orthogonal to the fourth easy-axis 432. The third easy-axis 422 and the fourth easy-axis 432 are parallel to the central axis 416 as shown in FIG. 2, the fifth free magnetization 428 and the sixth free magnetization 438 can be parallel or anti-parallel to each other, and the directions of the fifth pinned magnetization 426 and the sixth pinned magnetization 436 can be downward along the first incline 412 and upward along the second incline 414, or can be upward along the first incline 412 and downward along the second incline 414.

Figures 9A, 9B:
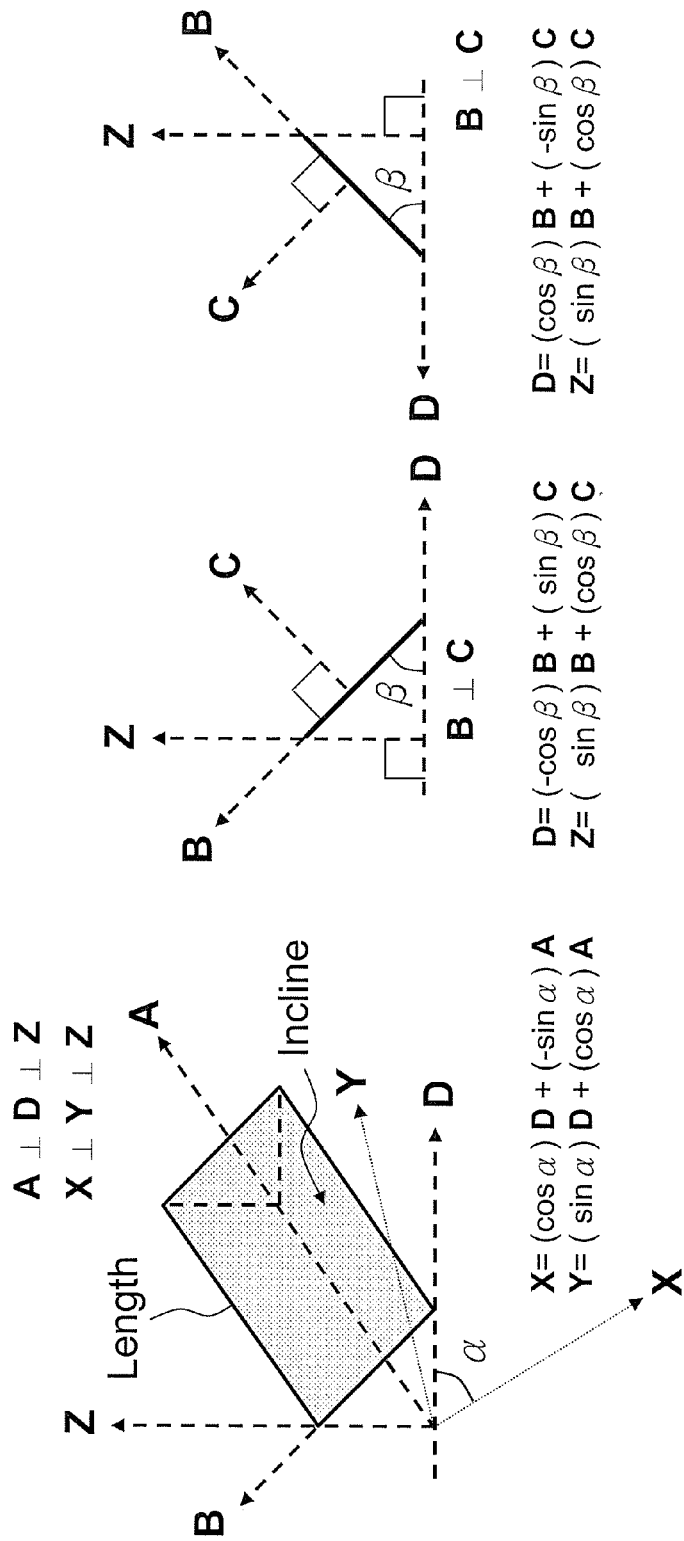
FIG. 9A and FIG. 9B are schematic diagrams illustrating a geometric coordinate relation between an incline and a substrate according to an embodiment of the disclosure.

FIG. 9A and FIG. 9B are schematic diagrams illustrating a geometric coordinate relation between the incline and the substrate according to an embodiment of the disclosure. Regarding the incline on the substrate shown in FIG. 9A and FIG. 9B, it is defined that a direction A on the substrate is along a length direction of the incline; a direction D on the substrate is orthogonal to the direction A on the substrate, and has an azimuth angle α with the X-axis; a direction orthogonal to the substrate is the Z-axis. Moreover, according to the cross-sectional view of FIG. 9B, a direction B along the incline can be defined to have a bevel angle β with the direction D. A direction C is orthogonal to the incline. Therefore, the magnetic field can be represented by the direction A, the direction B and the direction C of the incline.

According to the above descriptions, the conductivity of the third TMR 420 (to the left side) and the fourth TMR 430 (to the right side) can be respectively represented by following equations (5) and (6):

$$G_L = \frac{G_P}{2}\left[1 + \frac{1 - \frac{MR}{H_C}(H_X\cos\alpha\cos\beta + H_Y\sin\alpha\cos\beta - H_Z\sin\beta)}{1 + MR}\right]. \quad (5)$$

$$G_R = \frac{G_P}{2}\left[1 + \frac{1 - \frac{MR}{H_C}(H_X\cos\alpha\cos\beta + H_Y\sin\alpha\cos\beta + H_Z\sin\beta)}{1 + MR}\right]. \quad (6)$$

When the third TMR 420 and the fourth TMR 430 both are biased by a fixed voltage and the magnetic field is applied, then a difference of currents flowing through the third TMR 420 and the fourth TMR 430 is represented by a following equation (7):

$$\Delta I = (G_R - G_L)V = \Delta G \times V = \left[G_P \frac{-MR\frac{H_Z}{H_C}\sin\beta}{1 + MR}\right]V. \quad (7)$$

According to the equation (7), it is known that conductivity variations of the X-axis magnetic field and the Y-axis magnetic field are mutually cancelled, and the conductivity variation of the Z-axis magnetic field is remained, and a follow-up introduced sensing circuit can convert the conductivity variation of the Z-axis magnetic field into an electronic signal.

Figure 10:
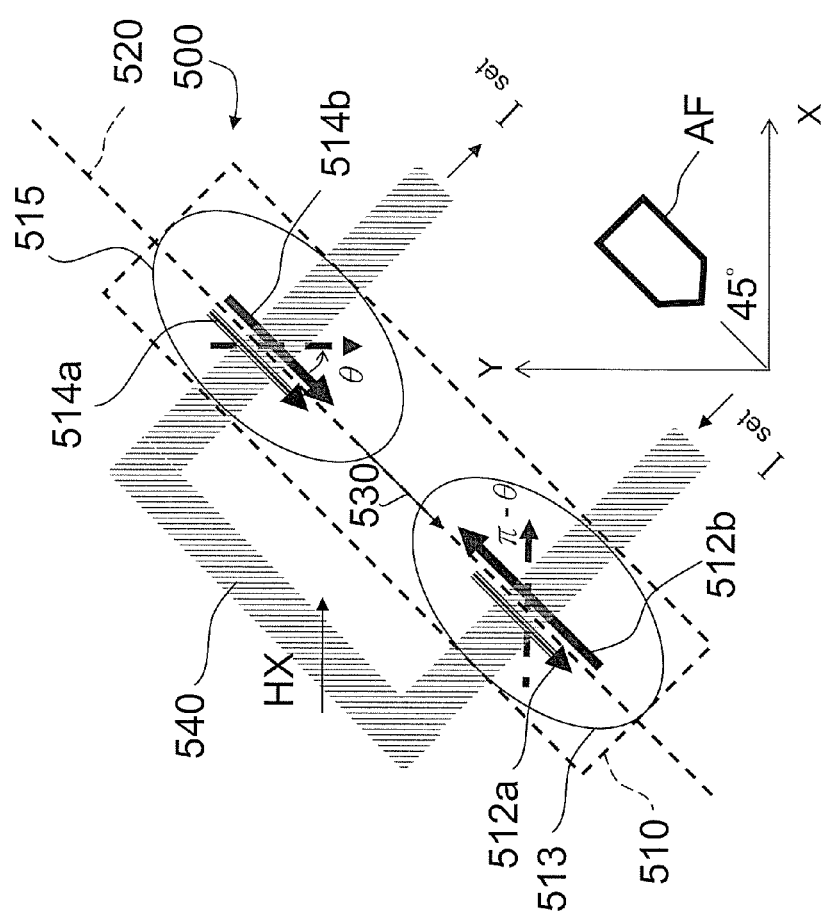
FIG. 10 is a schematic diagram of a tunneling magneto-resistance reference unit according to an embodiment of the disclosure.

FIG. 10 is a schematic diagram of a tunneling magneto-resistance reference unit according to an embodiment of the disclosure. The tunneling magneto-resistance reference unit 500 has a TMR with the same as that of the aforementioned first in-plane magnetic field sensor 200 (or the second in-plane magnetic field sensor 300), and details thereof are not repeated. Further, the tunneling magneto-resistance reference unit 500 has the fifth TMR 510, and a fifth pinned direction 530 is parallel to the fifth easy-axis 520. The fifth TMR 510 includes a seventh MTJ device 513 and an eighth MTJ device 515, wherein the seventh MTJ device 513 has a seventh pinned magnetization 512a parallel to the fifth pinned direction 530 and a seventh free magnetization 512b parallel to the fifth easy-axis 520, and the eighth MTJ device 515 has an eighth pinned magnetization 514a parallel to the fifth pinned direction 530 and an eighth free magnetization 514b parallel to the fifth easy-axis 520, the seventh pinned magnetization 512a and the eighth pinned magnetization 514a have the same direction, and the seventh free magnetization 512b and the eighth free magnetization 514b are anti-parallel.

Moreover, the tunneling magneto-resistance reference unit 500 further has a third metal wire path 540 crossing over the seventh MTJ device 513 and the eighth MTJ 515, and a setting current $I_{SET}$ can be applied to produce a magnetic field to set an initial state of the seventh free magnetization 512b and the eighth free magnetization 514b to be parallel to the fifth easy-axis 520 but anti-parallel to each other, and an conductivity $G_{ref}$ thereof is represented by a following equation (8):

$$G_{ref} = G_\theta + G_{\pi-\theta} = G_P\left[1 + \frac{1}{1 + MR}\right] = G_P + G_{AP}. \quad (8)$$

$$G_{\pi\mp\theta} = \frac{G_P}{2}\left[1 + \frac{1 + MR\cos(\pi\mp\theta)}{1 + MR}\right] = \frac{G_P}{2}\left(1 + \frac{1 - MR\cos\theta}{1 + MR}\right). \quad (9)$$

$$G_{\pm\theta} = \frac{G_P}{2}\left(1 + \frac{1 + MR\cos\theta}{1 + MR}\right). \quad (10)$$

Referring to FIG. 2 and FIG. 3, after the aforementioned deployment and fabrication are completed, an annealing magnetic field AF is applied during the annealing process, wherein the annealing magnetic field AF is parallel to an X-Y plane and respectively includes an angle of 45±5 degrees with the first easy-axis 220 and the second easy-axis 320 of the first in-plane magnetic field sensor 200 and the second in-plane magnetic field sensor 300. Moreover, the annealing magnetic field AF is orthogonal to the third easy-axis 422 and the fourth easy-axis 432, and is parallel to the fifth easy-axis 520. As a result, the first pinned magnetization 212a and the second pinned magnetization 214a of the first in-plane magnetic field sensor 200, the third pinned magnetization 312a and the fourth pinned magnetization 314a of the second in-plane magnetic field sensor 300, and the seventh pinned magnetization 512a and the eighth pinned magnetization 514a of the tunneling magneto-resistance reference unit 500 are all parallel to the annealing magnetic field AF. The fifth pinned magnetization 426 of the out-of-plane magnetic field sensor 400 is orthogonal to the third easy-axis 422, and the sixth pinned magnetization 436 is orthogonal to the fourth easy-axis 432.

Figure 11:
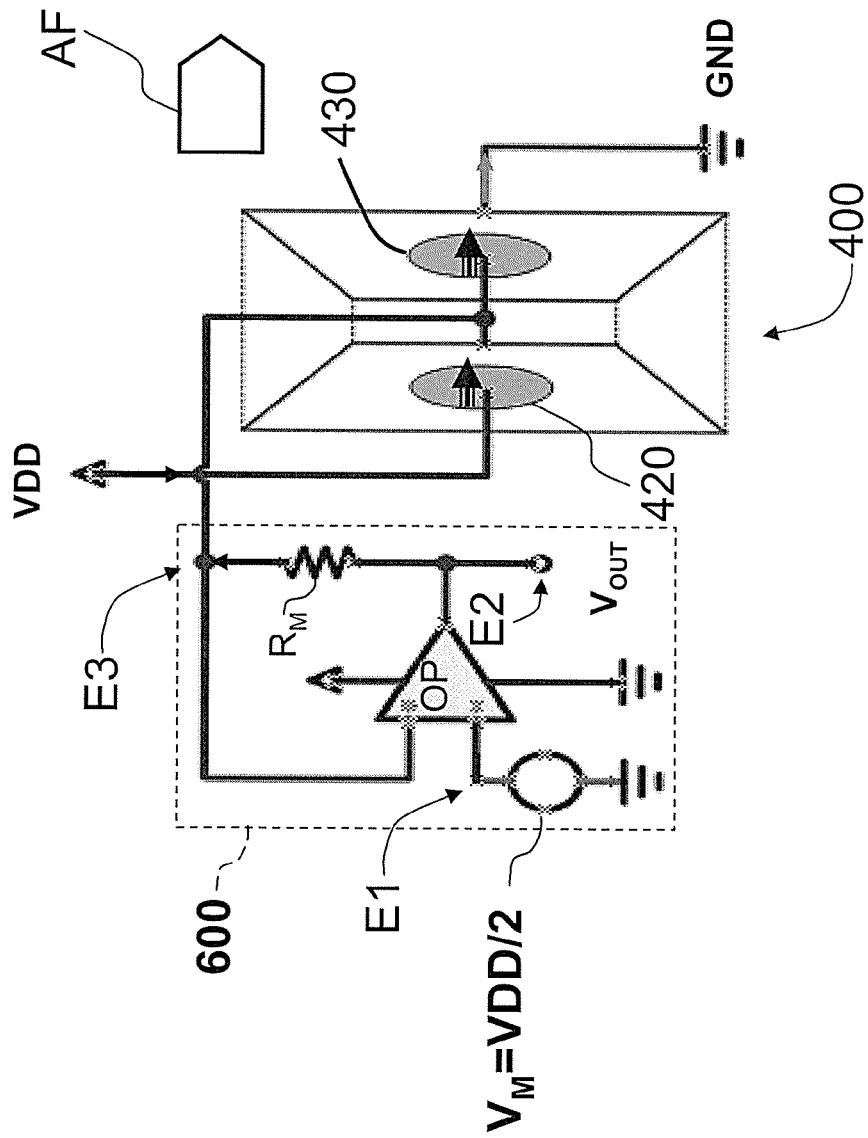
FIG. 11 is a circuit diagram of a circuit for converting a magnetic field sensed by an out-of-plane magnetic field sensor into an electronic signal according to an embodiment of the disclosure.

FIG. 11 is a circuit diagram of a circuit for converting a magnetic field sensed by an out-of-plane magnetic field sensor into an electronic signal according to an embodiment of the disclosure. Referring to FIG. 11, the magnetic field sensing circuit includes a voltage clamped signal transfer amplifier 600 and the magnetic field sensor, wherein the magnetic field sensor is, for example, the aforementioned out-of-plane magnetic field sensor 400. The voltage clamped signal transfer amplifier 600 has a positive input terminal E1, an output terminal E2, a negative input terminal E3 and a resistor $R_M$, wherein one end of the third TMR 420 and one end of the fourth TMR 430 are connected to each other and are connected to the negative input terminal E3, and the other end of the third TMR 420 is connected to a power VDD, and the other end of the fourth TMR 430 is connected to the ground. Moreover, the positive input terminal E1 is connected to a midpoint voltage source $V_M$ (VDD/2), and the resistor $R_M$ is connected between the output terminal E2 and the negative input terminal E3. In this way, the output terminal E2 and the negative input terminal E3 form a feedback through the resistor $R_M$, and the voltage of the negative input terminal E3 is clamped to a midpoint voltage VDD/2. The third TMR 420 and the fourth TMR 430 on the inclines 412 and 414 are all biased to the midpoint voltage VDD/2, and the conductivity variation of the TMR caused by the axial magnetic field is directly converted to a current variation. Now, the current values of the third TMR 420 and the fourth TMR 430 caused by the X-Y plane magnetic field are the same, and the current variations thereof caused by the Z-axis magnetic field are opposite. Due to the current conservation, a compensation current output by the voltage clamped signal transfer amplifier 600 is a difference of the currents flowing through the third TMR 420 and the fourth TMR 430, and the compensation current is converted to a symmetrically amplified voltage variation amount through the resistor $R_M$.

Figure 12:
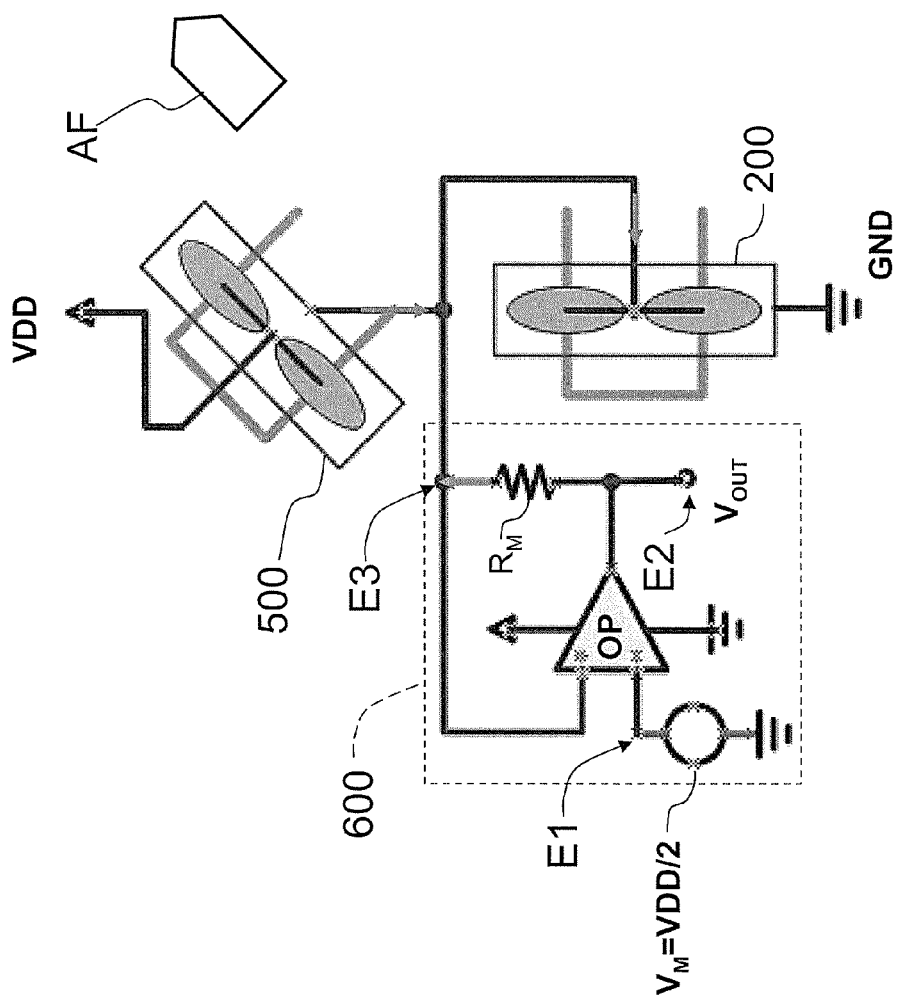
FIG. 12 is a circuit diagram of a circuit for converting a magnetic field sensed by an in-plane magnetic field sensor into an electronic signal according to an embodiment of the disclosure.

FIG. 12 is a circuit diagram of a circuit for converting a magnetic field sensed by an in-plane magnetic field sensor into an electronic signal according to an embodiment of the disclosure. Referring to FIG. 12, the voltage clamped signal transfer amplifier 600 has a positive input terminal E1, an output terminal E2, a negative input terminal E3 and a resistor $R_M$, wherein the positive input terminal E1 is connected to the midpoint voltage source $V_M$ (VDD/2), and the resistor $R_M$ is connected between the output terminal E2 and the negative input terminal E3. The magnetic field sensor is, for example, the first in-plane magnetic field sensor 200 or the second in-plane magnetic field sensor 300, and in one embodiment, the first in-plane magnetic field sensor 200 is taken as an example for description. One end of the tunneling magneto-resistance reference unit 500 is connected to the first in-plane magnetic field sensor 200, and is connected to the negative input terminal E3. The other end of the tunneling magneto-resistance reference unit 500 is connected to the power VDD. One end of the first in-plane magnetic field sensor 200 that is not connected to the tunneling magneto-resistance reference unit 500 is connected to the ground. In this way, the same to the aforementioned embodiment, the output terminal E2 and the negative input terminal E3 form the feedback through the resistor $R_M$, and the voltage of the negative input terminal E3 is clamped to the midpoint voltage VDD/2. Moreover, the tunneling magneto-resistance reference unit 500 and the first in-plane magnetic field sensor 200 are all biased to the midpoint voltage, and the conductivity variation of the first in-plane magnetic field sensor 200 caused by the axial magnetic field is directly converted to a current variation. Similarly, due to the current conservation, the compensation current output by the voltage clamped signal transfer amplifier 600 is a variation amount of the current flowing through the first in-plane magnetic field sensor 200, and the compensation current is converted to a symmetrically amplified voltage variation amount through the resistor $R_M$.

Figure 13:
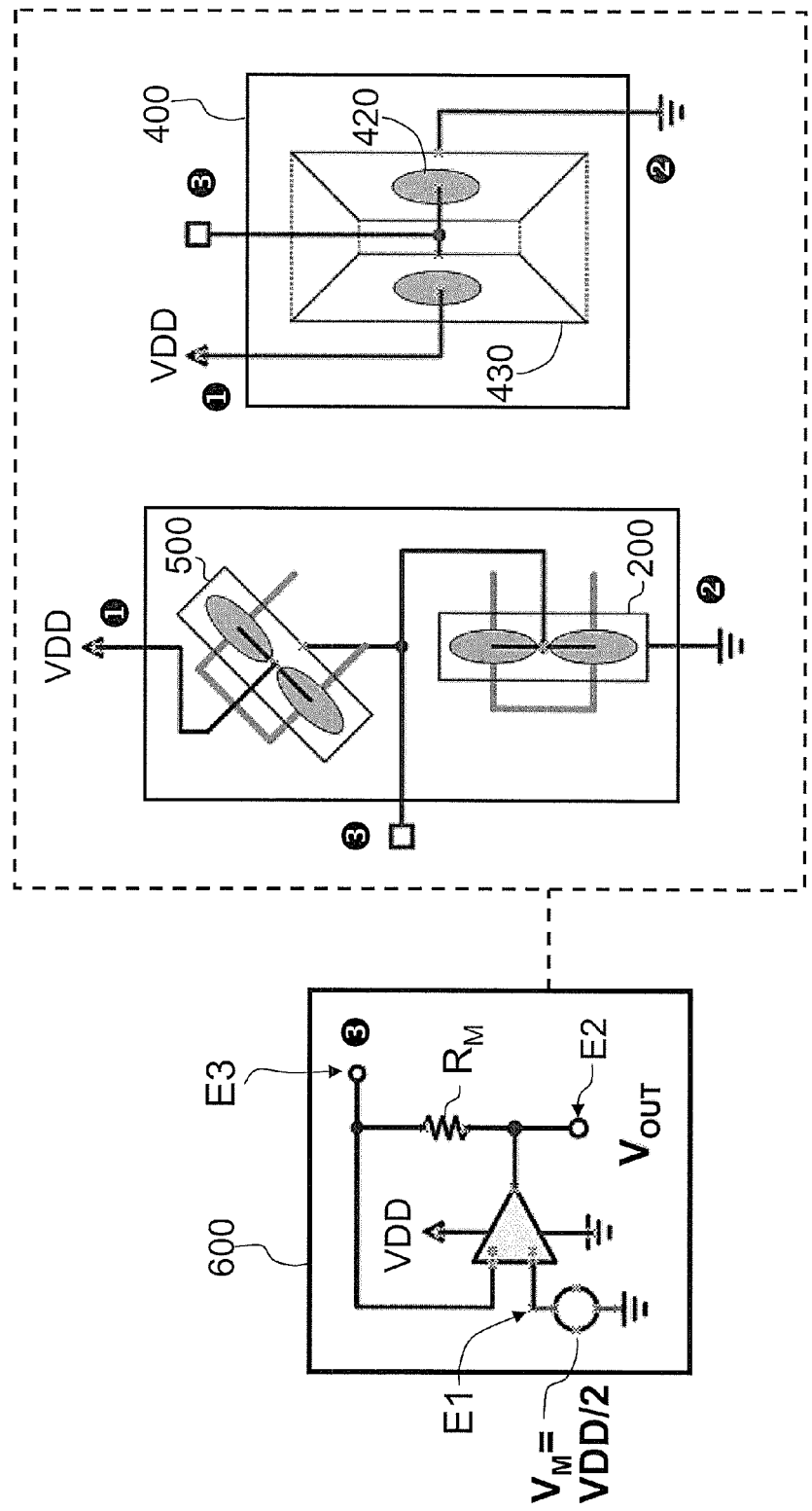
FIG. 13 illustrates a magnetic field sensing circuit according to an embodiment of the disclosure.

FIG. 13 is a circuit diagram of a magnetic field sensing circuit used for converting a magnetic field sensed by a 3-axis magnetic field sensor into an electronic signal according to an embodiment of the disclosure, wherein like reference numerals refer to the like elements throughout. Basically, the embodiment of FIG. 13 is a combination of the embodiments of FIG. 11 and FIG. 12, and details thereof are not repeated.

Figure 14:
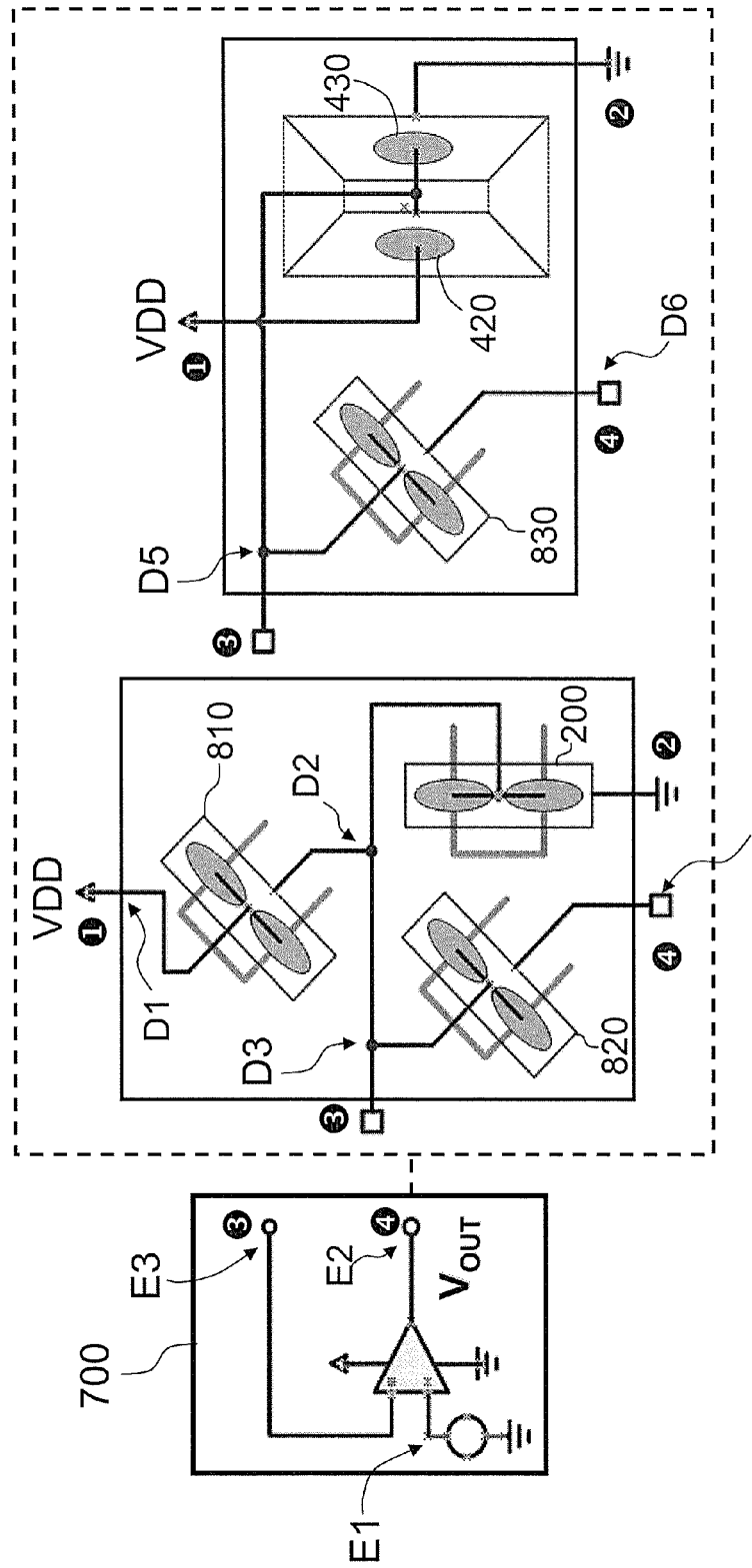
FIG. 14 illustrates a magnetic field sensing circuit according to another embodiment of the disclosure.

FIG. 14 is a circuit diagram of a magnetic field sensing circuit used for converting a magnetic field sensed by a 3-axis magnetic field sensor into an electronic signal according to another embodiment of the disclosure. The magnetic field sensing circuit includes an operational amplifier 700, a magnetic field sensor, a first tunneling magneto-resistance reference unit 810, a second tunneling magneto-resistance reference unit 820 and a third tunneling magneto-resistance reference unit 830. The operational amplifier 700 has a positive input terminal E1, an output terminal E2 and a negative input terminal E3, wherein the positive input terminal E1 is connected to a midpoint voltage source $V_M$ (VDD/2). The magnetic field sensor is, for example, the aforementioned out-of-plane magnetic field sensor and the first in-plane magnetic field sensor 200 (or the second in-plane magnetic field sensor 300, and in the embodiment, the first in-plane magnetic field sensor 200 is taken as an example for descriptions). The first tunneling magneto-resistance reference unit 810 has a first terminal D1 and a second terminal D2, wherein the first terminal D1 is connected to the power VDD. The second tunneling magneto-resistance reference unit 820 has a third terminal D3 and a fourth terminal D4. The fourth terminal D4 is connected to the output terminal E2, one end of the first in-plane magnetic field sensor 200 is connected to the ground, and the other end thereof is connected to the second terminal D2, the third terminal D3 and the negative input terminal E3. The third tunneling magneto-resistance reference unit 830 has a fifth terminal D5 and a sixth terminal D6. The fifth terminal D5 is connected to the negative input terminal E3, and the sixth terminal D6 is connected to the output terminal E2. One end of the third TMR 420 and one end of the fourth TMR 430 are connected to each other and are connected to the fifth terminal D5 and the negative input terminal E3. The other end of the third TMR 420 is connected to the power VDD. The other end of the fourth TMR 430 is connected to the ground. By using the tunneling magneto-resistance reference units 830 as the resistor $R_M$, a benefit of eliminating the temperature effect of the TMJ device is reaped, and a resistance value thereof can be adjusted to obtained a magnification factor of the design requirement $R_M = \alpha/G_P$, which is shown as a following equation (11):

$$\Delta V_Z = \Delta G_Z \frac{V_{DD}}{2} R_M =$$

$$\left(G_P \frac{MR}{1+MR} \frac{H_Z}{H_C} \sin\beta\right) \frac{V_{DD}}{2} \alpha G_P^{-1} = \alpha \frac{MR}{1+MR} \frac{H_Z}{H_C} \sin\beta \frac{V_{DD}}{2}$$

$$\Delta V_X = \Delta G_X \frac{V_{DD}}{2} R_M =$$

$$\left(\frac{G_P}{\sqrt{2}} \frac{MR}{1+MR} \frac{H_Z}{H_C}\right) \frac{V_{DD}}{2} \alpha G_P^{-1} = \frac{\alpha}{\sqrt{2}} \frac{MR}{1+MR} \frac{H_X}{H_C} \frac{V_{DD}}{2}$$

$$\Delta V_Y = \Delta G_Y \frac{V_{DD}}{2} R_M =$$

$$\left(\frac{G_P}{\sqrt{2}} \frac{MR}{1+MR} \frac{H_Y}{H_C}\right) \frac{V_{DD}}{2} \alpha G_P^{-1} = \frac{\alpha}{\sqrt{2}} \frac{MR}{1+MR} \frac{H_Y}{H_C} \frac{V_{DD}}{2}$$

(11).

In summary, in the aforementioned embodiment, based on deployment and fabrication of the aforementioned 2-axis in-plane magnetic field sensors, the Z-axis out-of-plane magnetic field sensor and the tunneling magneto-resistance reference unit, the single annealing magnetic field can be applied to fabricate the 3-axis magnetic field sensor. Moreover, in collaboration with the aforementioned sensing circuit, the output level and the signal amplification of the output sensing signal can be adjusted, and the magnetic field sensor may have linearity and high sensitivity in each axial direction, so as to greatly improve generality and decrease complexity and fabrication cost thereof.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:
1. A 3-axis magnetic field sensor, comprising:
a first in-plane magnetic field sensor, located on a substrate to sense an X-axis magnetic field, and having a first tunneling magneto-resistor (TMR) and a first easy-axis, wherein the first easy-axis is regarded as a Y-axis;
a second in-plane magnetic field sensor, located on the substrate to sense a Y-axis magnetic field, and having a second TMR and a second easy-axis, wherein the second easy-axis is regarded as an X-axis,
an included angle between the first easy-axis and the second easy-axis is 90±10 degrees, and a bisection direction on the substrate respectively include an angle of 45±5 degrees with the first easy-axis and the second easy-axis;
an out-of-plane magnetic field sensor, located on the substrate to sense a Z-axis magnetic field, and the out-of-plane magnetic field sensor comprising:
  a groove or bulge structure, located on the substrate, and having a first incline, a second incline and a central axis, wherein the first incline and the second incline have a same bevel angle relative to the substrate and are symmetric relative to the central axis, and the central axis is orthogonal to the bisection direction;
  a third TMR, formed on the first incline, and having a third easy-axis;
  a fourth TMR, formed on the second incline, and having a fourth easy-axis,
  wherein the third easy-axis and the fourth easy-axis are parallel to the central axis; and
a tunneling magneto-resistance reference unit, located on the substrate, and having a fifth TMR and a fifth easy-axis, wherein the fifth easy-axis is parallel to the bisection direction.

2. The 3-axis magnetic field sensor as claimed in claim 1, wherein the first TMR has a first pinned direction and comprises:
  a first bottom electrode, located on the substrate, and serving as a terminal of circuit connection;
  a first magnetic tunneling junction (MTJ) device, comprising:
    a first pinned layer of a magnetic material, located on the first bottom electrode, and having a first pinned magnetization parallel to the first pinned direction;
    a first tunneling layer of a non-magnetic material, disposed on the first pinned layer; and
    a first free layer of a magnetic material, disposed on the first tunneling layer, and having a first free magnetization parallel to the first easy-axis, wherein the first pinned direction and the first easy-axis form a first included angle there between;
  a second MTJ device, comprising:
    a second pinned layer of a magnetic material, located on the first bottom electrode, and having a second pinned magnetization parallel to the first pinned direction;
    a second tunneling layer of a non-magnetic material, disposed on the second pinned layer; and
    a second free layer of a magnetic material, disposed on the second tunneling layer, and having a second free magnetization parallel to the first easy-axis; and
  a first top electrode, connected to the first free layer and the second free layer, and serving as a terminal of circuit connection,
  wherein the first free magnetization and the second free magnetization are parallel to the first easy-axis under an initial state but are anti-parallel to each other, and the first included angle between the first pinned direction and the first easy-axis is substantially 45±5 degrees or 135±5 degrees, wherein a first magnetic field sensing direction is orthogonal to the first easy-axis on the substrate.

3. The 3-axis magnetic field sensor as claimed in claim 2, further comprising:
  a first metal wire, capable of conducting current to produce a magnetic field, so as to set the initial state of the first free magnetization and the second free magnetization to be parallel to the first easy-axis but anti-parallel to each other.

4. The 3-axis magnetic field sensor as claimed in claim 1, wherein the second TMR has a second pinned direction and comprises:
  a second bottom electrode, located on the substrate, and serving as a terminal of circuit connection;
  a third MTJ device, comprising:
    a third pinned layer of a magnetic material, located on the second bottom electrode, and having a third pinned magnetization parallel to the second pinned direction;
    a third tunneling layer of a non-magnetic material, disposed on the third pinned layer; and
    a third free layer of a magnetic material, disposed on the third tunneling layer, and having a third free magnetization parallel to the second easy-axis, wherein the second pinned direction and the second easy-axis form a second included angle there between;
  a fourth MTJ device, comprising:
    a fourth pinned layer of a magnetic material, located on the second bottom electrode, and having a fourth pinned magnetization parallel to the second pinned direction;
    a fourth tunneling layer of a non-magnetic material, disposed on the fourth pinned layer; and
    a fourth free layer of a magnetic material, disposed on the fourth tunneling layer, and having a fourth free magnetization parallel to the second easy-axis; and
  a second top electrode, connected to the third free layer and the fourth free layer, and serving as a terminal of circuit connection,
  wherein the third free magnetization and the fourth free magnetization are parallel to the second easy-axis under the initial state but are anti-parallel to each other, and the second included angle between the second pinned direction and the second easy-axis is substantially 45±5 degrees or 135±5 degrees, wherein the a second magnetic field sensing direction is orthogonal to the second easy-axis on the substrate.

5. The 3-axis magnetic field sensor as claimed in claim 4, further comprising:
  a second metal wire, capable of conducting current to produce a magnetic field, so as to set the initial state of the third free magnetization and the fourth free magnetization to be parallel to the second easy-axis but anti-parallel to each other.

6. The 3-axis magnetic field sensor as claimed in claim 1, wherein the third TMR comprises:
  a third bottom electrode, located on the first incline, and serving as a terminal of circuit connection;
  a fifth MTJ device, comprising:
    a fifth pinned layer of a magnetic material, located on the third bottom electrode, and having a fifth pinned magnetization along the first incline and orthogonal to the third easy-axis;
    a fifth tunneling layer of a non-magnetic material, disposed on the fifth pinned layer; and
    a fifth free layer of a magnetic material, disposed on the fifth tunneling layer, and having a fifth free magnetization parallel to the third easy-axis; and
  a third top electrode, connected to the fifth free layer, and serving as a terminal of circuit connection;
wherein the fourth TMR comprises:
  a fourth bottom electrode, located on the second incline, and serving as a terminal of circuit connection;
  a sixth MTJ device, comprising:
    a sixth pinned layer of a magnetic material, located on the fourth bottom electrode, and having a sixth pinned magnetization along the second incline and orthogonal to the fourth easy-axis;
a sixth tunneling layer of a non-magnetic material, disposed on the sixth pinned layer; and
a sixth free layer of a magnetic material, disposed on the sixth tunneling layer, and having a sixth free magnetization parallel to the fourth easy-axis, wherein the fifth free magnetization and the sixth free magnetization are parallel to each other or anti-parallel to each other; and
a fourth top electrode, connected to the sixth free layer, and serving as a terminal of circuit connection.

7. The 3-axis magnetic field sensor as claimed in claim 1, wherein the fifth TMR has a fifth pinned direction parallel to the fifth easy-axis, and comprises:
a fifth bottom electrode, located on the substrate, and serving as a terminal of circuit connection;
a seventh MTJ device, comprising:
a seventh pinned layer of a magnetic material, located on the fifth bottom electrode, and having a seventh pinned magnetization parallel to the fifth pinned direction;
a seventh tunneling layer of a non-magnetic material, disposed on the seventh pinned layer; and
a seventh free layer of a magnetic material, disposed on the seventh tunneling layer, and having a seventh free magnetization parallel to the fifth easy-axis; and
an eighth MTJ device, comprising:
an eighth pinned layer of a magnetic material, located on the fifth bottom electrode, and having an eighth pinned magnetization parallel to the fifth pinned direction, wherein the seventh pinned magnetization and the eighth pinned magnetization are in a same direction;
an eighth tunneling layer of a non-magnetic material, disposed on the eighth pinned layer; and
an eighth free layer of a magnetic material, disposed on the eighth tunneling layer, and having an eighth free magnetization parallel to the fifth easy-axis; and
a fifth top electrode, connected to the seventh free layer and the eighth free layer, and serving as a terminal of circuit connection,
wherein the seventh free magnetization and the eighth free magnetization are parallel to the fifth easy-axis under the initial state but are anti-parallel to each other.

8. The 3-axis magnetic field sensor as claimed in claim 7, further comprising:
a third metal wire, capable of conducting current to produce a magnetic field, so as to set the initial state of the seventh free magnetization and the eighth free magnetization to be parallel to the fifth easy-axis but anti-parallel to each other.

9. A method for fabricating a magnetic field sensing structure, wherein the magnetic field sensing structure is the 3-axis magnetic field sensor as claimed of claim 1, the method for fabricating the magnetic field sensing structure comprising:
applying a single annealing magnetic field on the 3-axis magnetic field sensor, wherein a direction of the single annealing magnetic field is parallel to an X-Y plane, and respectively include an angle of 45±5 degrees with the first easy-axis and the second easy-axis, and is orthogonal to the third easy-axis and the fourth easy-axis, and is parallel to the fifth easy-axis.

10. A magnetic field sensing circuit, configured to convert a magnetic field sensed by a magnetic field sensor into an electronic signal, the magnetic field sensing circuit comprising:
a magnetic field sensor, wherein the magnetic field sensor is the out-of-plane magnetic field sensor as claimed in claim 1; and
a voltage clamped signal transfer amplifier, having a positive input terminal, an output terminal, a negative input terminal and a resistor, wherein one end of the third TMR and one end of the fourth TMR are connected to each other and are connected to the negative input terminal, the other end of the third TMR is connected to a power, the other end of the fourth TMR is connected to ground, the positive input terminal is connected to a midpoint voltage source, and the resistor is connected between the output terminal and the negative input terminal.

11. A magnetic field sensing circuit, configured to convert a magnetic field sensed by a magnetic field sensor into an electronic signal, comprising:
a magnetic field sensor, wherein the magnetic field sensor is the first in-plane magnetic field sensor or the second in-plane magnetic field sensor as claimed in claim 1;
a voltage clamped signal transfer amplifier, having a positive input terminal, an output terminal, a negative input terminal and a resistor, wherein the positive input terminal is connected to a midpoint voltage source, and the resistor is connected between the output terminal and the negative input terminal; and
a tunneling magneto-resistance reference unit, having one end connected to the magnetic field sensor and connected to the negative input terminal, and having the other end connected to a power, wherein the other end of the magnetic field sensor that is not connected to the tunneling magneto-resistance reference unit is connected to ground.

12. A magnetic field sensing circuit, configured to convert a magnetic field sensed by a 3-axis magnetic field sensor into an electronic signal, the magnetic field sensing circuit comprising:
a voltage clamped signal transfer amplifier, having a positive input terminal, an output terminal, a negative input terminal and a resistor, wherein the positive input terminal is connected to a midpoint voltage source, and the resistor is connected between the output terminal and the negative input terminal;
a magnetic field sensor, wherein the magnetic field sensor is the out-of-plane magnetic field sensor, the first in-plane magnetic field sensor or the second in-plane magnetic field sensor as claimed in claim 1, wherein one end of the third TMR and one end of the fourth TMR are connected to each other and are connected to the negative input terminal, the other end of the third TMR is connected to a power, and the other end of the fourth TMR is connected to ground; and
a tunneling magneto-resistance reference unit, having one end connected to the first in-plane magnetic field sensor or the second in-plane magnetic field sensor and connected to the negative input terminal, wherein the other end of the first in-plane magnetic field sensor or the second in-plane magnetic field sensor that is not connected to the tunneling magneto-resistance reference unit is connected to ground.

13. A magnetic field sensing circuit, configured to convert a magnetic field sensed by a 3-axis magnetic field sensor into an electronic signal, the magnetic field sensing circuit comprising:
- an operational amplifier, having a positive input terminal, an output terminal and a negative input terminal, wherein the positive input terminal is connected to a voltage source;
- a magnetic field sensor, wherein the magnetic field sensor is the out-of-plane magnetic field sensor, the first in-plane magnetic field sensor or the second in-plane magnetic field sensor as claimed in claim 1;
- a first tunneling magneto-resistance reference unit, having a first terminal and a second terminal, wherein the first terminal is connected to a power;
- a second tunneling magneto-resistance reference unit, has a third terminal and a fourth terminal, wherein the fourth terminal is connected to the output terminal, one end of the first in-plane magnetic field sensor or the second in-plane magnetic field sensor is connected to ground, and the other end thereof is connected to the second terminal, the third tell final and the negative input terminal;
- a third tunneling magneto-resistance reference unit, having a fifth terminal and a sixth terminal, wherein the fifth terminal is connected to the negative input terminal, and the sixth terminal is connected to the output terminal, one end of the third TMR and one end of the fourth TMR are connected to each other and are connected to the fifth terminal and the negative input terminal, the other end of the third TMR is connected to the power, and the other end of the fourth TMR is connected to the ground.

* * * * *